(12) United States Patent
Zhu et al.

(10) Patent No.: US 7,328,047 B2
(45) Date of Patent: *Feb. 5, 2008

(54) MOBILE WIRELESS COMMUNICATIONS DEVICE WITH REDUCED INTERFERING ENERGY FROM THE DISPLAY AND RELATED METHODS

(75) Inventors: Lizhong Zhu, Waterloo (CA); Michael Corrigan, Waterloo (CA); Perry Jarmuszewski, Waterloo (CA); Liviu George, Mississauga (CA); George Mankaruse, Kitchener (CA); James Robinson, Elmira (CA); Marc Drader, Kitchener (CA)

(73) Assignee: Research in Motion Limited, Waterloo, Ontario (CA)

( * ) Notice: Subject to any disclaimer, the term of this patent is extended or adjusted under 35 U.S.C. 154(b) by 98 days.

This patent is subject to a terminal disclaimer.

(21) Appl. No.: 11/065,243

(22) Filed: Feb. 24, 2005

(65) Prior Publication Data

US 2006/0046787 A1 Mar. 2, 2006

Related U.S. Application Data

(60) Provisional application No. 60/605,786, filed on Aug. 31, 2004.

(51) Int. Cl.
*H04M 1/00* (2006.01)
(52) U.S. Cl. .................... 455/566; 455/575.1
(58) Field of Classification Search ............ 455/575, 455/550.1, 90.3, 66.1, 403, 556.2, 425, 88, 455/566, 575.1, 68.1; 379/387, 428, 433; 333/181–186; 381/71, 318, 94
See application file for complete search history.

(56) References Cited

U.S. PATENT DOCUMENTS

| 4,187,481 | A | | 2/1980 | Boutros ................. 333/182 |
|---|---|---|---|---|
| 5,117,073 | A | | 5/1992 | Mischenko ............. 200/61.7 |
| 5,165,055 | A | * | 11/1992 | Metsler ................. 333/12 |
| 5,596,638 | A | | 1/1997 | Paterson et al. .......... 379/430 |
| 5,621,363 | A | | 4/1997 | Ogden et al. ............. 333/12 |
| 5,656,872 | A | | 8/1997 | Lee .................... 307/91 |
| 5,764,693 | A | | 6/1998 | Taylor et al. ............ 375/222 |

(Continued)

FOREIGN PATENT DOCUMENTS

EP 0 805 562 11/1997

(Continued)

OTHER PUBLICATIONS

Patent Abstracts of Japan, JP 05121891 (Hitachi Zosen Corp), May 18, 1993, abstract, 3 pages.

*Primary Examiner*—Naghmeh Mehrpour
(74) *Attorney, Agent, or Firm*—Allen, Dyer, Doppelt, Milbrath & Gilchrist, P.A.

(57) ABSTRACT

A mobile wireless communications device includes a housing and circuit board carried by the housing and includes radio frequency (RF) circuitry and a processor carried by the circuit board and operative with each other. A display connector for an LCD connector is mounted on the circuit board and adapted to be connected to a display. Display connection lines are carried by the circuit board and interconnect the display connector and processor for carrying signals from the processor to the display connector and a connected display. Filters are carried by the circuit board and connected to the display connection lines and reduce any interfering energy from the processor and display.

24 Claims, 12 Drawing Sheets

U.S. PATENT DOCUMENTS

| | | | |
|---|---|---|---|
| 5,911,121 A * | 6/1999 | Andrews | 455/418 |
| 5,963,588 A * | 10/1999 | Yatim et al. | 375/222 |
| 6,207,912 B1 | 3/2001 | Persson | 200/305 |
| 6,307,944 B1 | 10/2001 | Garratt et al. | 381/312 |
| 6,624,503 B1 | 9/2003 | Madsen et al. | 257/659 |
| 6,628,508 B2 | 9/2003 | Lieu et al. | 361/680 |
| 6,647,367 B2 | 11/2003 | McArthur et al. | 704/226 |
| 6,654,593 B1 | 11/2003 | Simmons et al. | 455/234.1 |
| 6,742,185 B1 | 5/2004 | Andrews | 725/75 |
| 6,823,176 B2 | 11/2004 | Rogers | 455/67.13 |
| 6,867,763 B2 | 3/2005 | Griffin et al. | 345/168 |
| 7,027,841 B2 * | 4/2006 | Ishii | 455/569.1 |
| 2002/0106091 A1 | 8/2002 | Furst et al. | 381/91 |
| 2003/0066672 A1 | 4/2003 | Watchko et al. | 174/50 |
| 2003/0202664 A1 | 10/2003 | Brodkin | 381/1 |
| 2004/0081099 A1 | 4/2004 | Patterson et al. | 370/241 |
| 2004/0178995 A1 | 9/2004 | Sterling | 345/173 |
| 2004/0208334 A1 | 10/2004 | Bryson et al. | 381/365 |
| 2005/0075691 A1 | 4/2005 | Phillips et al. | 607/60 |
| 2005/0123025 A1 | 6/2005 | Sorrells et al. | 375/130 |
| 2006/0046770 A1 * | 3/2006 | Zhu et al. | 455/550.1 |
| 2006/0046787 A1 | 3/2006 | Zhu et al. | 455/566 |
| 2006/0120499 A1 * | 6/2006 | Simmons et al. | 375/368 |

FOREIGN PATENT DOCUMENTS

| | | |
|---|---|---|
| EP | 1 467 434 | 10/2004 |
| GB | 2349006 | 10/2000 |
| GB | 2 381 956 A | 5/2003 |
| JP | 10 271048 | 10/1998 |
| WO | 02/25975 | 3/2002 |
| WO | 2004/086587 | 10/2004 |

* cited by examiner

MOBILE WIRELESS COMMUNICATIONS DEVICE WITH REDUCED INTERFERING ENERGY FROM THE DISPLAY AND RELATED METHODS

RELATED APPLICATION

This application is based upon prior filed copending provisional application Ser. No. 60/605,786 filed Aug. 31, 2004.

FIELD OF THE INVENTION

The present invention relates to the field of communications devices, and more particularly, to mobile wireless communications devices and related methods.

BACKGROUND OF THE INVENTION

Cellular communication systems continue to grow in popularity and have become an integral part of both personal and business communications. Cellular telephones allow users to place and receive phone calls most anywhere they travel. Moreover, as cellular telephone technology is increased, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

As the functionality of cellular communications devices continues to increase, so too does demand for smaller devices that are easier and more convenient for users to carry. As any circuit boards and electronic components thereon are reduced in size and placed closer together, including antenna and microphone components, various electronic components can pick up conductive energy and create interference within the system. For example, an internal surface mounted microphone could pick up conducted energy directly from a power amplifier or from the radiated energy emitted by an antenna. This unwanted reception of conducted/near field radiated energy from power amplifiers and antennae is particularly problematic in a packet burst transmission as part of a Global System for Mobile communications (GSM) system, including the 450 MHz, 900 MHz, 1800 MHz and 1900 MHz frequency bands.

Other interfering signals can be generated when the liquid crystal display (LCD) in some mobile wireless communications devices radiates radio frequency (RF) interfering energy and degrades receiver sensitivity. This is problematic where the interfering energy is generated by the microprocessor or central processing unit (CPU) of a wireless mobile communications device and fed into the LCD lines, along with interfering energy generated by the LCD itself. Other problems occur when the conducted and radiated interfering radio frequency (RF) energy is coupled to the mobile wireless communications device causing audio break through tests to fail for both the uplink and downlink. Even the keyboard circuits can create unwanted interference problems. For example, the radio frequency receiver sensitivity is often degraded by the electromagnetic interference (EMF) of digital harmonics from the microprocessor or CPU via the keyboard because of the resulting loop formed by any keyboard circuits. In some instances, strong RF energy, for example, the transmitted power from the radio via the antenna interferes with or couples to the microprocessor or CPU input/output (I/O) lines of a mobile wireless communications device through the keyboard Key-In and Key-Out lines and causes a reset of the microprocessor or CPU.

SUMMARY OF THE INVENTION

It is therefore an object of the present invention to reduce interfering energy from a processor and display into display connection lines operatively connected between a display connector and processor on a circuit board within a mobile wireless communications device.

A mobile wireless communications device includes a housing and a circuit board carried by the housing and including radio frequency (RF) circuitry and a processor carried by the circuit board and operative with each other. A display connector is mounted on the circuit board and adapted to be connected to a display. The display can be carried by the housing and formed as a liquid crystal display (LCD) and the display connector would be a LCD connector.

Display connection lines are carried by the circuit board and interconnect the display connector and processor for carrying signals from the processor for display on any display connected to the display connector. Filters, such as electromagnetic interference (EMI) filters are carried by the circuit board and connected into the display connection lines for reducing any interfering energy from the processor in a display into the display connection lines.

In one aspect of the invention, a bypass capacitor is connected to ground and into each respective display connection line. The filters can be serially connected into each display connection line. Each filter could be formed as a ferrite inductor or an LC filter serially connected into each display connection line.

In another aspect of the invention, the housing is configured for handheld operation. The RF circuitry and processor can be operative as a cellular communications device. The filters could also be formed as a plurality of arrays of LC filters serially connected into each display connection line. A voltage regulator circuit could be operatively connected to the filters wherein the RF circuitry and processor are operative as a Wireless Local Area Network (WLAN) device. A second filter element could be connected into each display connection line and serially connected to each other filter that is connected within each display connection line and serially connected to each other filter that is connected within said display connection lines. Each second filter element could be formed as an inductor. An antenna could also be mounted within the housing and operative with the RF circuitry. The connection lines could be formed as LCD connection lines and formed parallel to each other. A method is also set forth.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The interference problems created when an internal microphone, for example, a surface-mounted technology (SMT) microphone "picks-up" or receives conducted energy directly from a power amplifier and/or from an antenna during a GSM transmitter packet burst are overcome with the present invention. The use of an appropriate RF shielding and filters in one non-limiting example reduces the audible buzz in an audio circuit, for example, as used in the mobile wireless communications device of FIGS. 1-3. In one non-limiting example, a separately isolated radio frequency (RF) shield covers the internal microphone and its associated circuitry to prevent conducted and near field radiated energy emitted by a power amplifier from interfering with the microphone operation. The RF shield also provides adequate isolation from the radiated energy emitted by the antenna during a GSM packet burst. This RF shield is operative in conjunction with an acoustic seal to ensure a good acoustic frequency response.

The different non-limiting embodiments and examples of the present invention described throughout the following description offers several advantages over prior art mobile wireless communications devices, systems and associated methods. By adding electromagnetic interference (EMI) filters to liquid crystal display (LCD) connection lines, the central processing unit (CPU) or microprocessor noise is prevented from reaching the LCD. As a result, the prior art problems associated with an LCD radiating radio frequency (RF) interfering energy and causing degradation of receiver sensitivity, or the microprocessor or CPU generating any interfering energy, is overcome. These prior art disadvantages have been overcome in one particular embodiment of the invention by adding filter components to the LCD circuitry and eliminating any noise before it can be radiated by the LCD and interfere with a received signal.

Figure 1:
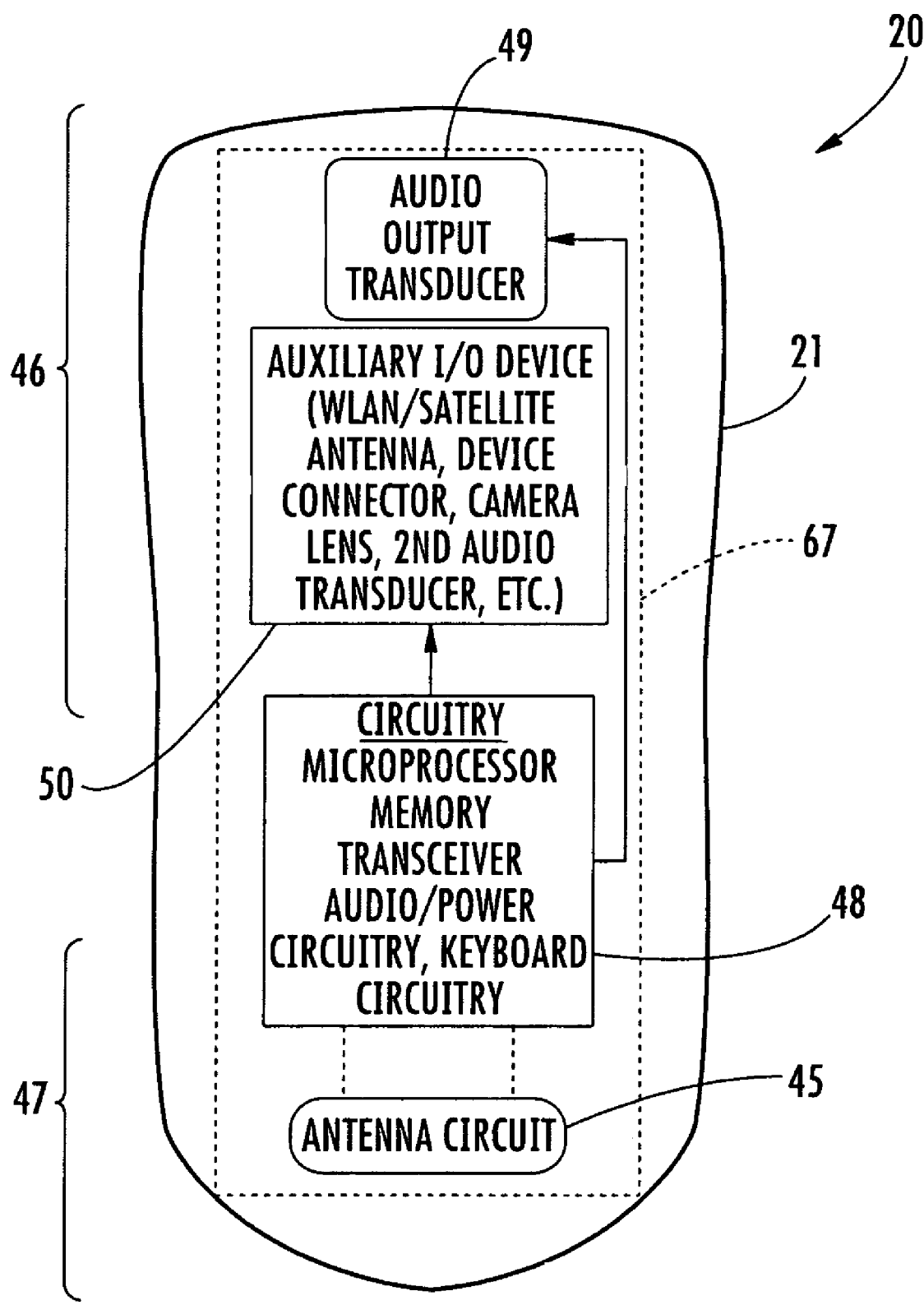
FIG. 1 is a schematic block diagram of an example of a mobile wireless communications device configured as a handheld device that can be used with the present invention and illustrating basic internal components thereof.
Figure 2:
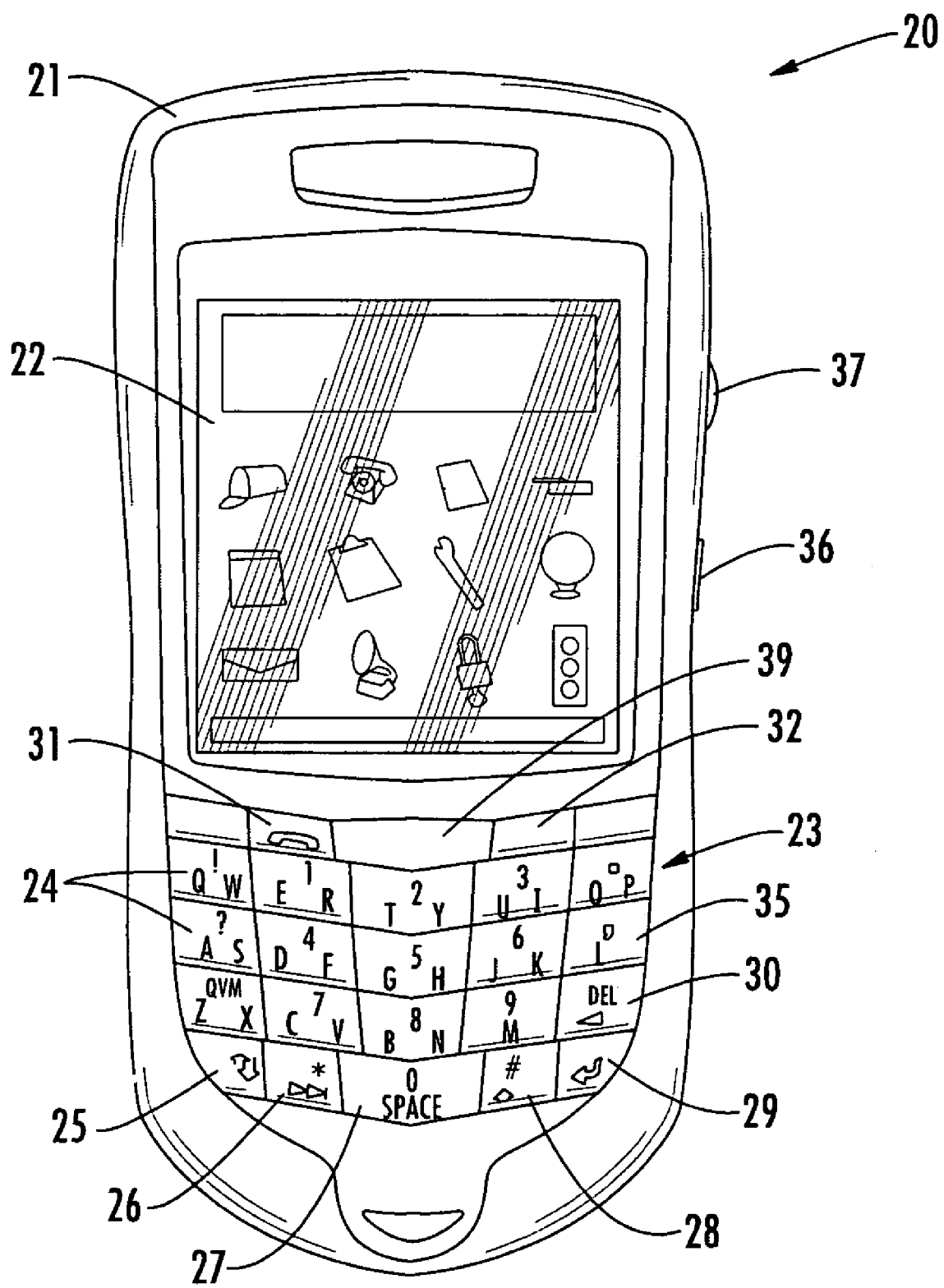
FIG. 2 is a front elevation view of the mobile wireless communications device of FIG. 1.
Figure 3:
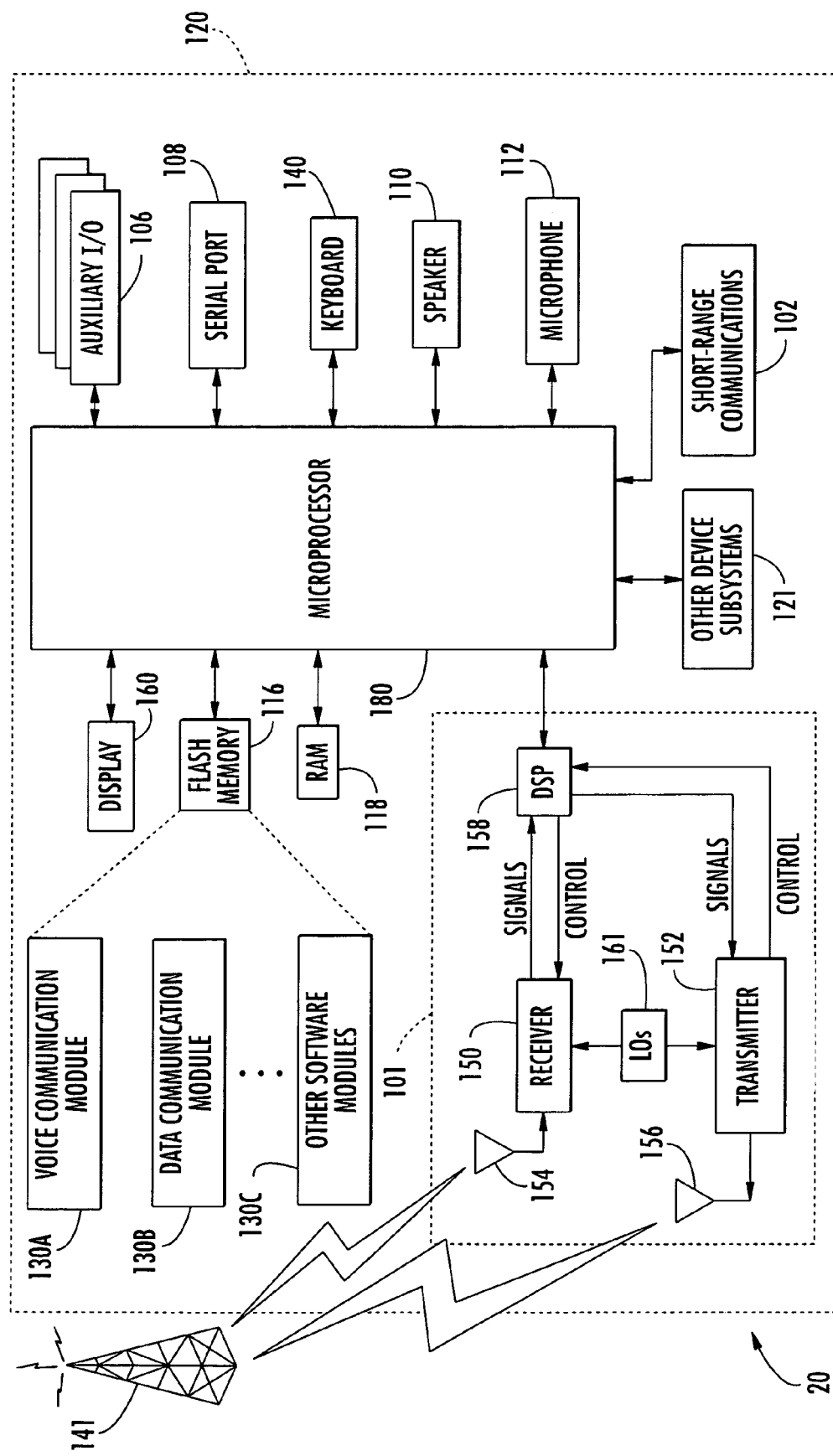
FIG. 3 is a schematic block diagram showing basic functional circuit components that can be used in the mobile wireless communications device of FIGS. 1-2.

The prior art problems associated with the electromagnetic interference (EMI) in an audio break-through test for communications devices such as shown in FIGS. 1-3 is also overcome by reducing the conducted and radiated interfering RF energy that is coupled to the mobile wireless communications device, which could create an audible noise and cause RF immunity failure in both the uplink and downlink communications. An EMI filter can be added to the microphone, a USB connector, speaker audio circuits and headset connector at desired circuit points to eliminate the conducted interfering RF energy from the coupling to the audio circuits via a USB charging cable and the radiated, interfering RF energy that is coupled to any audio circuits resulting from the pick-up on a headset cable or other similar connector.

The present invention also overcomes the prior art electromagnetic interference problems associated when the sensitivity of a radio frequency receiver such as the type shown in FIGS. 1-3 is degraded by any electromagnetic interference, for example, digital harmonics from the microprocessor or CPU via the keypad (keyboard). It is known that the sensitivity of the RF receiver is significantly degraded by the digital noise generated from the microprocessor or other CPU through the Key_In/Key_Out lines and into the keyboard traces and picked-up by the antenna. By adding within the keyboard traces and Key_In/Key_Out lines, EMI filter circuit, for example, filter array such as formed from series resistors or inductors, shunt capacitors, series EMI ferrite beads or a combination of resistor, inductor and capacitor, and ferrite beads, the receiver sensitivity is improved.

The present invention also overcomes the prior disadvantages when strong RF energy, for example, the transmitted power from a mobile wireless communications device such as shown in FIGS. 1-3 and its antenna interferes with or couples to the microprocessor or other CPU input/output lines through the keyboard Key_In and Key_Out lines and causes the microprocessor or CPU to reset. In accordance with one non-limiting embodiment, series elements such as resistors can be applied to the keyboard Key_In and Key_Out lines to dampen the RF energy picked up by these lines from either the generated internal energy or external interfering signals. Specific resistor values are selected to eliminate the RF energy, but also ensure normal CPU/keyboard operation. Other elements can be used, for example, series inductors, inductor and capacitor, or ferrite beads.

A brief description will now proceed relative to FIGS. 1-3, which disclose an example of a mobile wireless communications device, for example, a handheld portable cellular radio, which can incorporate the non-limiting examples of the various circuits of the present invention. FIGS. 1-3 are representative non-limiting examples of the many different types of functional circuit components and their interconnection, and operative for use with the present invention.

Referring initially to FIGS. 1 and 2, an example of a mobile wireless communications device 20, such as a handheld portable cellular radio, which can be used with the present invention is first described. This device 20 illustratively includes a housing 21 having an upper portion 46 and a lower portion 47, and a dielectric substrate (i.e., circuit board) 67, such as a conventional printed circuit board (PCB) substrate, for example, carried by the housing. A housing cover (not shown in detail) would typically cover the front portion of the housing. The term circuit board 67 as used hereinafter can refer to any dielectric substrate, PCB, ceramic substrate or other circuit carrying structure for carrying signal circuits and electronic components within the mobile wireless communications device 20. The illustrated housing 21 is a static housing, for example, as opposed to a flip or sliding housing which are used in many cellular telephones. However, these and other housing configurations may also be used.

Circuitry 48 is carried by the circuit board 67, such as a microprocessor, memory, one or more wireless transceivers (e.g., cellular, WLAN, etc.), which includes RF circuitry, including audio and power circuitry, including any keyboard circuitry. It should be understood that keyboard circuitry could be on a separate keyboard, etc., as will be appreciated by those skilled in the art. A battery (not shown) is also preferably carried by the housing 21 for supplying power to the circuitry 48. The term RF circuitry could encompass the interoperable RF transceiver circuitry, power circuitry and audio circuitry.

Furthermore, an audio output transducer 49 (e.g., a speaker) is carried by an upper portion 46 of the housing 21 and connected to the circuitry 48. One or more user input interface devices, such as a keypad (keyboard) 23 (FIG. 2), is also preferably carried by the housing 21 and connected to the circuitry 48. The term keypad as used herein also refers to the term keyboard, indicating the user input devices having lettered and/or numbered keys commonly known and other embodiments, including multi-top or predictive entry modes. Other examples of user input interface devices include a scroll wheel 37 and a back button 36. Of course, it will be appreciated that other user input interface devices (e.g., a stylus or touch screen interface) may be used in other embodiments.

An antenna 45 is preferably positioned at the lower portion 47 in the housing and can be formed as a pattern of conductive traces that make an antenna circuit, which physically forms the antenna. It is connected to the circuitry 48 on the main circuit board 67. In one non-limiting example, the antenna could be formed on an antenna circuit board section that extends from the circuit board at the lower portion of the housing. By placing the antenna 45 adjacent the lower portion 47 of the housing 21, the distance is advantageously increased between the antenna and the user's head when the phone is in use to aid in complying with applicable SAR requirements. Also, a separate keyboard circuit board could be used.

More particularly, a user will typically hold the upper portion of the housing 21 very close to his head so that the audio output transducer 49 is directly next to his ear. Yet, the lower portion 47 of the housing 21 where an audio input transducer (i.e., microphone) is located need not be placed directly next to a user's mouth, and can be held away from the user's mouth. That is, holding the audio input transducer close to the user's mouth may not only be uncomfortable for the user, but it may also distort the user's voice in some circumstances. In addition, the placement of the antenna 45 adjacent the lower portion 47 of the housing 21 also advantageously spaces the antenna farther away from the user's brain.

Another important benefit of placing the antenna 45 adjacent the lower portion 47 of the housing 21 is that this may allow for less impact on antenna performance due to blockage by a user's hand. That is, users typically hold cellular phones toward the middle to upper portion of the phone housing, and are therefore more likely to put their hands over such an antenna than they are an antenna mounted adjacent the lower portion 47 of the housing 21. Accordingly, more reliable performance may be achieved from placing the antenna 45 adjacent the lower portion 47 of the housing 21.

Still another benefit of this configuration is that it provides more room for one or more auxiliary input/output (I/O) devices 50 to be carried at the upper portion 46 of the housing. Furthermore, by separating the antenna 45 from the auxiliary I/O device(s) 50, this may allow for reduced interference therebetween.

Some examples of auxiliary I/O devices 50 include a WLAN (e.g., Bluetooth, IEEE 802.11) antenna for providing WLAN communication capabilities, and/or a satellite positioning system (e.g., GPS, Galileo, etc.) antenna for providing position location capabilities, as will be appreciated by those skilled in the art. Other examples of auxiliary I/O devices 50 include a second audio output transducer (e.g., a speaker for speaker phone operation), and a camera lens for providing digital camera capabilities, an electrical device connector (e.g., USB, headphone, secure digital (SD) or memory card, etc.).

It should be noted that the term "input/output" as used herein for the auxiliary I/O device(s) 50 means that such devices may have input and/or output capabilities, and they need not provide both in all embodiments. That is, devices such as camera lenses may only receive an optical input, for example, while a headphone jack may only provide an audio output.

The device 20 further illustratively includes a display 22, for example, a liquid crystal display (LCD) carried by the housing 21 and connected to the circuitry 48. A back button 36 and scroll wheel 37 can also be connected to the circuitry 48 for allowing a user to navigate menus, text, etc., as will be appreciated by those skilled in the art. The scroll wheel 37 may also be referred to as a "thumb wheel" or a "track wheel" in some instances. The keypad 23 illustratively includes a plurality of multi-symbol keys 24 each having indicia of a plurality of respective symbols thereon. The keypad 23 also illustratively includes an alternate function key 25, a next key 26, a space key 27, a shift key 28, a return (or enter) key 29, and a backspace/delete key 30.

The next key 26 is also used to enter a "*" symbol upon first pressing or actuating the alternate function key 25. Similarly, the space key 27, shift key 28 and backspace key 30 are used to enter a "0" and "#", respectively, upon first actuating the alternate function key 25. The keypad 23 further illustratively includes a send key 31, an end key 32, and a convenience (i.e., menu) key 39 for use in placing cellular telephone calls, as will be appreciated by those skilled in the art.

Moreover, the symbols on each key 24 are arranged in top and bottom rows. The symbols in the bottom rows are entered when a user presses a key 24 without first pressing the alternate function key 25, while the top row symbols are entered by first pressing the alternate function key. As seen in FIG. 2, the multi-symbol keys 24 are arranged in the first three rows on the keypad 23 below the send and end keys 31, 32. Furthermore, the letter symbols on each of the keys 24 are arranged to define a QWERTY layout. That is, the letters on the keypad 23 are presented in a three-row format, with the letters of each row being in the same order and relative position as in a standard QWERTY keypad.

Each row of keys (including the fourth row of function keys 25-29) is arranged in five columns. The multi-symbol keys 24 in the second, third, and fourth columns of the first, second, and third rows have numeric indicia thereon (i.e., 1 through 9) accessible by first actuating the alternate function key 25. Coupled with the next, space, and shift keys 26, 27, 28, which respectively enter a "*", "0", and "#" upon first actuating the alternate function key 25, as noted above, this set of keys defines a standard telephone keypad layout, as would be found on a traditional touch-tone telephone, as will be appreciated by those skilled in the art.

Accordingly, the mobile wireless communications device 20 as described may advantageously be used not only as a traditional cellular phone, but it may also be conveniently used for sending and/or receiving data over a cellular or other network, such as Internet and email data, for example. Of course, other keypad configurations may also be used in other embodiments. Multi-tap or predictive entry modes may be used for typing e-mails, etc. as will be appreciated by those skilled in the art.

The antenna 45 is preferably formed as a multi-frequency band antenna, which provides enhanced transmission and reception characteristics over multiple operating frequencies. More particularly, the antenna 45 is designed to provide high gain, desired impedance matching, and meet applicable SAR requirements over a relatively wide bandwidth and multiple cellular frequency bands. By way of example, the antenna 45 preferably operates over five bands, namely a 850 MHz Global System for Mobile Communications (GSM) band, a 900 MHz GSM band, a DCS band, a PCS band, and a WCDMA band (i.e., up to about 2100 MHz), although it may be used for other bands/frequencies as well. To conserve space, the antenna 45 may advantageously be implemented in three dimensions although it may be implemented in two-dimensional or planar embodiments as well.

The mobile wireless communications device shown in FIGS. 1 and 2 can incorporate e-mail and messaging accounts and provide different functions such as composing e-mail, PIN messages, and SMS messages. The device can manage messages through an appropriate menu that can be retrieved by choosing a messages icon. An address book function could add contacts, allow management of an address book, set address book options and manage SIM card phone books. A phone menu could allow for the making and answering of phone calls using different phone features, managing phone call logs, setting phone options, and viewing phone information. A browser application could permit the browsing of web pages, configuring a browser, adding bookmarks, and changing browser options. Other applications could include a task, memo pad, calculator, alarm and games, as well as handheld options with various references.

A calendar icon can be chosen for entering a calendar program that can be used for establishing and managing events such as meetings or appointments. The calendar program could be any type of messaging or appointment/meeting program that allows an organizer to establish an event, for example, an appointment or meeting.

A non-limiting example of various functional components that can be used in the exemplary mobile wireless communications device 20 of FIGS. 1 and 2 is further described in the example below with reference to FIG. 3. The device 20 illustratively includes a housing 120, a keypad 140 and an output device 160. The output device 160 shown is preferably a display, which is preferably a full graphic LCD. Other types of output devices may alternatively be used. A processing device 180 is contained within the housing 120 and is coupled between the keypad 140 and the display 160. The processing device 180 controls the operation of the display 160, as well as the overall operation of the mobile device 20, in response to actuation of keys on the keypad 140 by the user.

The housing 120 may be elongated vertically, or may take on other sizes and shapes (including clamshell housing structures). The keypad may include a mode selection key, or other hardware or software for switching between text entry and telephony entry.

In addition to the processing device 180, other parts of the mobile device 20 are shown schematically in FIG. 3. These include a communications subsystem 101; a short-range communications subsystem 102; the keypad 140 and the display 160, along with other input/output devices 106, 108, 110 and 112; as well as memory devices 116, 118 and various other device subsystems 121. The mobile device 20 is preferably a two-way RF communications device having voice and data communications capabilities. In addition, the mobile device 20 preferably has the capability to communicate with other computer systems via the Internet.

Operating system software executed by the processing device 180 is preferably stored in a persistent store, such as the flash memory 116, but may be stored in other types of memory devices, such as a read only memory (ROM) or similar storage element. In addition, system software, specific device applications, or parts thereof, may be temporarily loaded into a volatile store, such as the random access memory (RAM) 118. Communications signals received by the mobile device may also be stored in the RAM 118.

The processing device 180, in addition to its operating system functions, enables execution of software applications 130A-130N on the device 20. A predetermined set of applications that control basic device operations, such as data and voice communications 130A and 130B, may be installed on the device 20 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 141. Preferably, the PIM data items are seamlessly integrated, synchronized and updated via the wireless network 141 with the device user's corresponding data items stored or associated with a host computer system.

Communication functions, including data and voice communications, are performed through the communications subsystem 101, and possibly through the short-range communications subsystem. The communications subsystem 101 includes a receiver 150, a transmitter 152, and one or more antennae 154 and 156. In addition, the communications subsystem 101 also includes a processing module, such as a digital signal processor (DSP) 158, and local oscillators (LOs) 161. The specific design and implementation of the communications subsystem 101 is dependent upon the communications network in which the mobile device 20 is intended to operate. For example, the mobile device 20 may include a communications subsystem 101 designed to operate with the Mobitex™, Data TAC™ or General Packet Radio Service (GPRS) mobile data communications networks, and also designed to operate with any of a variety of voice communications networks, such as AMPS, TDMA, CDMA, PCS, GSM, etc. Other types of data and voice networks, both separate and integrated, may also be utilized with the mobile device 20.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card, in order to operate on a GPRS network.

When required network registration or activation procedures have been completed, the mobile device 20 may send and receive communications signals over the communication network 141. Signals received from the communications network 141 by the antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communications functions, such as demodulation and decoding. In a similar manner, signals to be transmitted to the network 141 are processed (e.g., modulated and encoded) by the DSP 158 and are then provided to the transmitter 152 for digital to analog conversion, frequency up conversion, filtering, amplification and transmission to the communication network 141 (or networks) via the antenna 156.

In addition to processing communications signals, the DSP 158 provides for control of the receiver 150 and the transmitter 152. For example, gains applied to communications signals in the receiver 150 and transmitter 152 may be adaptively controlled through automatic gain control algorithms implemented in the DSP 158.

In a data communications mode, a received signal, such as a text message or web page download, is processed by the communications subsystem 101 and is input to the processing device 180. The received signal is then further processed by the processing device 180 for an output to the display 160, or alternatively to some other auxiliary I/O device 106. A device user may also compose data items, such as e-mail messages, using the keypad 140 and/or some other auxiliary I/O device 106, such as a touchpad, a rocker switch, a thumb-wheel, or some other type of input device. The composed data items may then be transmitted over the communications network 141 via the communications subsystem 101.

In a voice communications mode, overall operation of the device is substantially similar to the data communications mode, except that received signals are output to a speaker 110, and signals for transmission are generated by a microphone 112. Alternative voice or audio I/O subsystems, such as a voice message recording subsystem, may also be implemented on the device 20. In addition, the display 160 may also be utilized in voice communications mode, for example to display the identity of a calling party, the duration of a voice call, or other voice call related information.

Any short-range communications subsystem enables communication between the mobile device 20 and other proximate systems or devices, which need not necessarily be similar devices. For example, the short-range communications subsystem may include an infrared device and associated circuits and components, or a Bluetooth™ communications module to provide for communication with similarly-enabled systems and devices.

Figure 4:
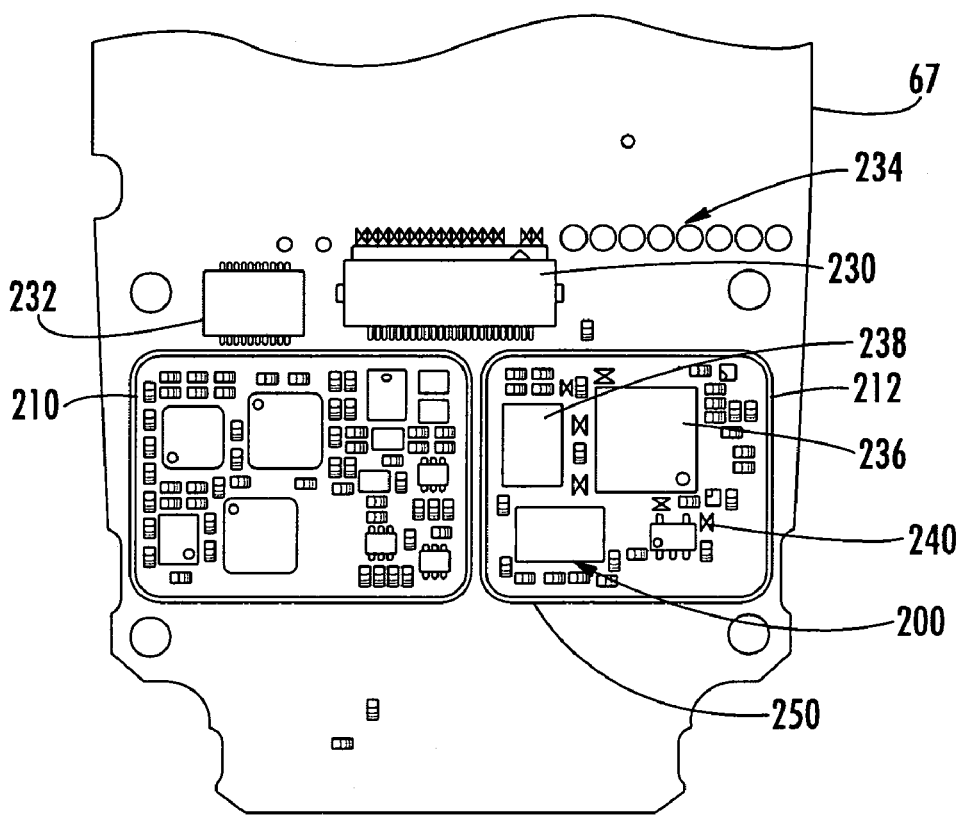
FIG. 4 is front elevational view of the mobile wireless communications device in accordance with one embodiment of the present invention having the front cover removed to illustrate an example of RF circuitry, power amplifier, surface mounted microphone and noise isolation components associated thereof.

In accordance with a) non-limiting example of the present invention, FIG. 4 shows an example of a circuit layout on part of the circuit board 67 that can be included within the mobile wireless communications device 20 of FIGS. 1-3, and showing a front cover removed from a housing to illustrate a surface mounted microphone 200 and its circuitry and associated noise isolation components as will be explained in greater detail below. The circuit board 67 includes radio frequency (RF) circuitry, for example, cellular telephone communications circuitry, which is mounted in first and second isolation shields or "cans" 210,212, as often called by those skilled in the art, forming a compartment on the circuit board, each which receive the RF circuitry. Each can 210,212 forms a radio frequency isolation compartment and may include sides and a top. The first can 210 includes a transceiver chip set 220, for example, a transmitter chip, receiver chip, and local oscillator chip as non-limiting examples with those chips labeled A, B and C. Other illustrated components could include the various resistors, capacitors, amplifiers, regulators and other circuit components common to those devices, but not explained in detail.

Located outside first and second isolation cans 210,212, but mounted on the circuit board 67, is a liquid crystal display (LCD) connector 230 and a keyboard connector 232, as well as associated circuit components 234. These components 230, 232 and 234 can be configured in different configurations besides the configuration illustrated in the non-limiting example of FIG. 4. The compartment within the second isolation can 212 includes a power amplifier 236 and switch diplexer 238. Other components 240 are mounted within the compartment and form the resistors, capacitors, transistors, and inductors necessary to drive the audio and power circuits for the microphone, power amplifier and other circuits.

To provide microphone isolation, a radio frequency isolation shield 250, formed in the illustrated non-limiting example as a third isolation "can" 250, is positioned at a corner of the second "can" 212, and forms another isolation compartment at this corner. The shield is formed as a separate metallic housing secured to the circuit board and surrounding the microphone, effectively covering, i.e., shielding the entire microphone. Although a "can" configuration formed as a metallic housing with top and sides and is used for the RF shield, other configurations could be used.

The compartment formed by the isolation shield 250 receives a microphone 200 formed preferably as a surface mounted microphone integrated circuit chip 200 on the circuit board 67. As illustrated in this non-limiting configuration, this places the microphone chip adjacent to the bottom center of the device 20 where the sound hole is typically located in the cover of a cellular phone or similar mobile wireless communications device. The present invention overcomes the drawback when the microphone 200 is in relatively close proximity to the RF circuitry such that the microphone picks-up unwanted noise. This is particularly problematic when the RF circuitry is transmitting Global Systems for Mobile communications (GSM) transmission packet bursts, for example, but not limited to GSM. This type of noise often results in an audible buzz during operation. Furthermore, the noise problem can be further compounded by increases in diameter of any sound hole in the housing cover, even small diameter holes. This problem worsens as the diameter of the acoustical tube that connects the sound hole to the microphone increases.

To reduce this noise resulting from the RF circuitry, the metallic shield or "can" forming an isolation shield includes a side and top metal wall, i.e., forming a complete isolation shield surrounding, i.e., covering the microphone 200 and its associated circuitry to provide isolation from the RF circuitry. This isolation shield provides the necessary isolation from the RF amplifiers and from any energy radiated from the antenna.

Figure 5:
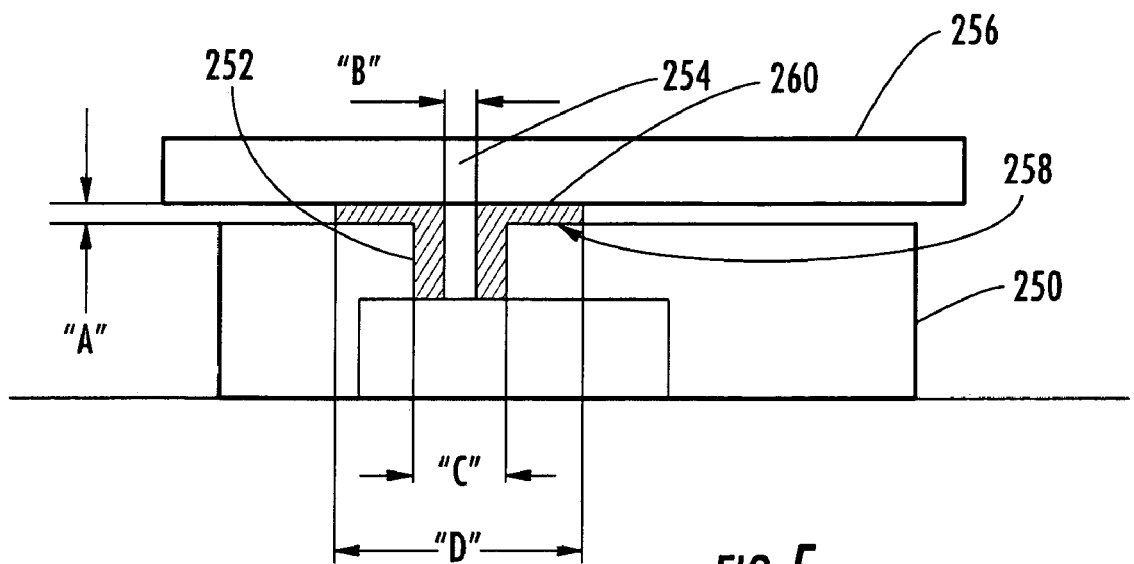
FIG. 5 is an enlarged fragmentary sectional view of greater details of the microphone and associated noise isolation components of FIG. 4.

FIG. 5 shows an enlarged, fragmentary, sectional view of the microphone 200 of FIG. 4 when the communications device 20 is assembled and a housing cover, such as including keyboard plastics, is positioned over the housing and circuit board. The microphone 200 has an associated assembly that includes a rubber or other polymer acoustical tube 252 that connects a sound hole 254 in the housing cover 256 forming part of keyboard plastics with the microphone 200, which extends through a hole 258 in the top of the microphone isolation shield 250. It should be understood that other suitable materials could also be used for the acoustical tube 252. The housing cover 256 could be formed from plastic or similar material and have access holes (not shown) for corresponding keys of a telephone keypad, or in the case of a cellular phone with a personal digital assistant (PDA) or e-mail/Internet capabilities, an alphanumeric keypad, as appreciated by those skilled in the art and shown in FIG. 2 as a non-limiting example.

Figure 12:
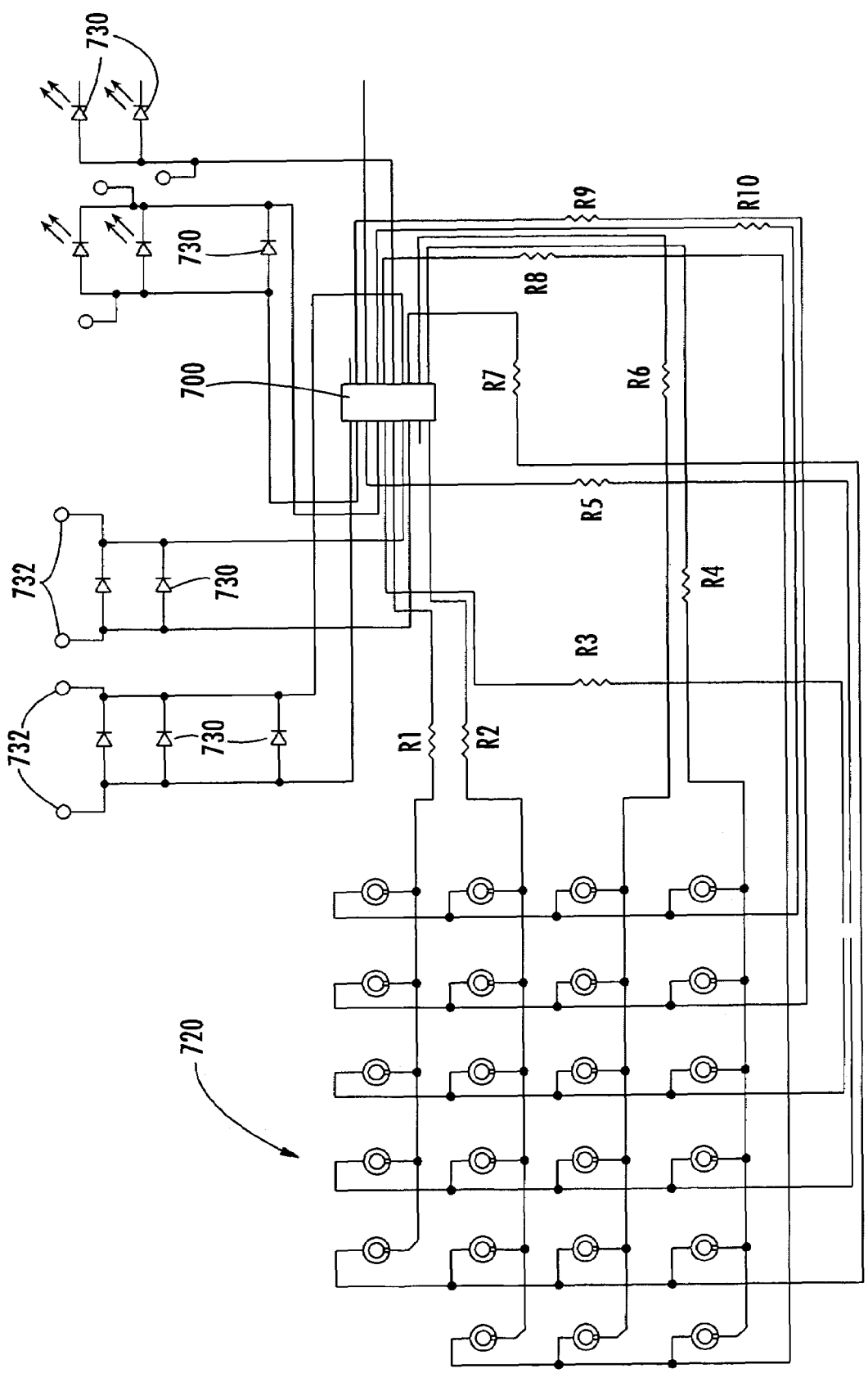
FIG. 12 is a schematic circuit diagram showing a key array and EMI filtering components connected between the key array and keypad connector, all connected on a keyboard, and adapted for use in the mobile wireless communications device shown in FIGS. 1-3 and operative for filtering when signals are transmitted.

The keyboard plastics, such as shown in FIG. 5, are preferably formed as a separate keyboard positioned over the circuit board 67. This separate keyboard includes a keyboard, i.e., keypad connector, which engages the keyboard connector 232. Mounted on the keyboard are a keypad array circuit, the keypad or keyboard connector that engages the keyboard connector on the main circuit board 67, and Key_In and Key_Out lines that connect the keypad connector and the keypad array. These lines could be formed as signal traces. Examples of these components on a keyboard are shown in FIG. 12. This keyboard could be part of the housing cover 256 or separate from the housing cover. Thus, throughout this description, the term housing cover is broad enough to encompass the keyboard as a separate plastic or similarly configured keyboard or other support that covers all or a portion of the circuit board 67 and contains the keypad connector, Key_In/Key_Out lines and keypad array circuit, such as shown in FIG. 12, as a non-limiting example.

In addition, an isolation ring 260 is positioned between the microphone isolation shield 250 and the housing cover 256. This ring 260 surrounds the acoustical tube 252. When the communications device 20 is assembled and the front housing cover 256 is installed, the downward force on the ring 260 causes it to contact both the microphone isolation shield 250 and the housing cover 256 to provide RF and acoustic sealing, as will be appreciated by those skilled in the art. The ring 260 is preferably formed from a metal material. The isolation shield 250 and its associated ring 260 could be configured and dimensioned to provide a desired acoustic frequency response, as will be appreciated by those skilled in the art.

Representative distances as non-limiting examples for the configuration shown in FIG. 5 are now set forth. It should be understood that these non-limiting examples of dimensions can vary depending on the design, configuration, and frequencies used.

The distance between the housing cover 256 and the top surface isolation of microphone isolation shield 250 could be about 0.1 mm, for example, as indicated by dimension "A" and the sound hole 254 in the housing cover 256 could be about 2.0 mm or less as represented by the dimension "B". The acoustical tube 252 may have a diameter of about 5.0 mm as represented by the dimension "C" and the diameter of the isolation ring 260 can be about 10.0 mm as represented by the dimension "D", as non-limiting examples. Additional filters, such as ferrite choke filters, for example, can be used inside the microphone isolation shield 250 to reduce conducted interference to a greater extent, as will be appreciated by those skilled in the art. Furthermore, the microphone isolation shield 250 can be implemented with devices other than cellular telephones. For example, a portable, wireless local area network (WLAN) communications device may transmit voice/sound data over a WLAN device and thus include a microphone positioned in a similar manner to that discussed above. Similar noise reduction components could be used as non-limiting examples.

It should be understood that the acoustic channel formed within the acoustic tube 252 allows the communications device 20 to pass a specific acoustical mark for certification and allows a certain frequency response out of the cavity and its microphone isolation shield 250, i.e., for network certification.

Figure 6:
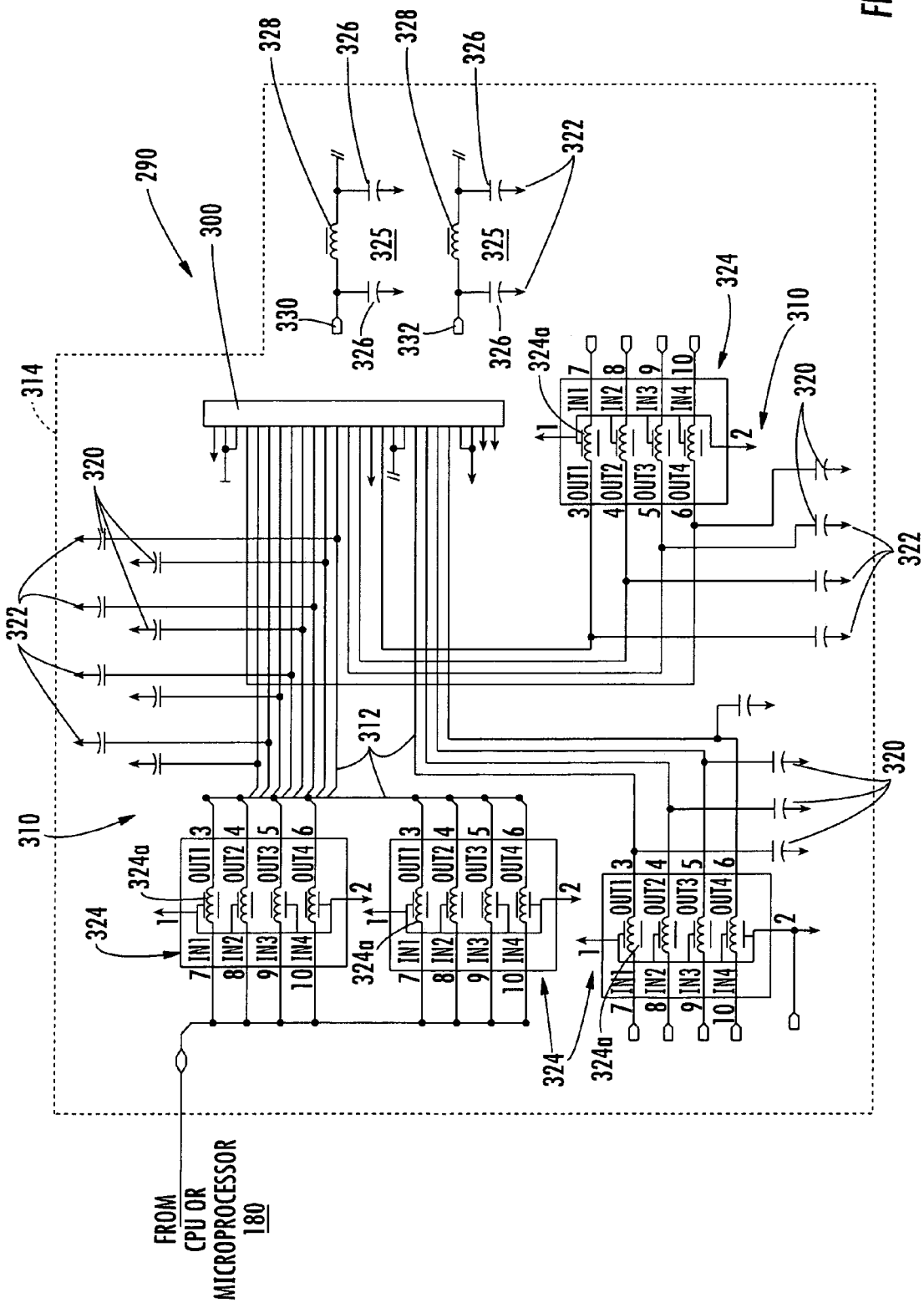
FIG. 6 is a schematic circuit diagram of an LCD display connector and associated filter components that can be used with the mobile wireless communications device of FIGS. 1-3 in accordance with one embodiment of the present invention.
Figure 7:
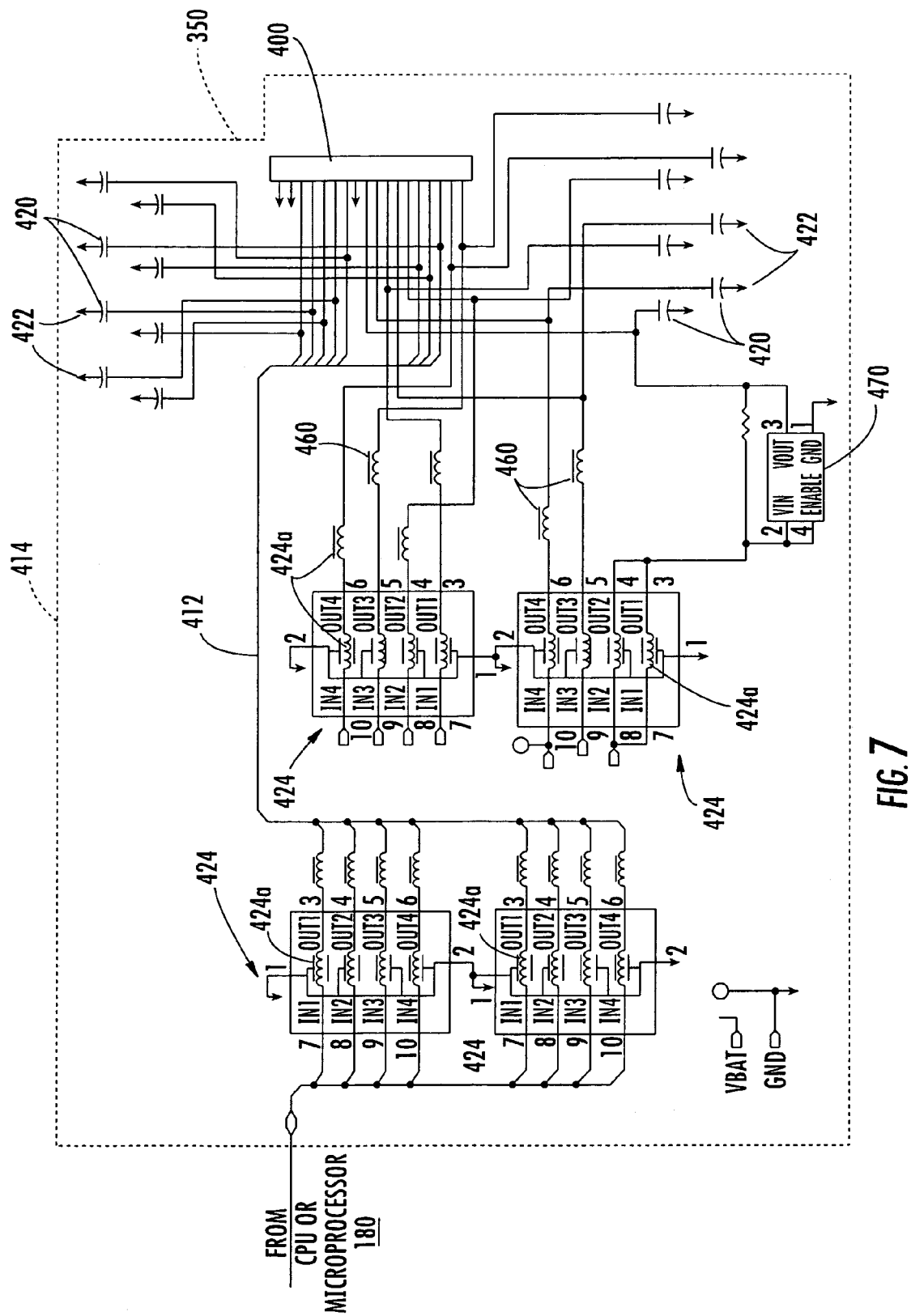
FIG. 7 is a schematic circuit diagram of a LCD display connector and associated filter components that can be used with a mobile wireless local area network (WLAN) communications device in accordance with another embodiment of the present invention.

As noted before, the LCD in certain examples of the communications device 20 can radiate RF interfering energy and degrade receiver sensitivity. Interfering energy can also be generated by the CPU of the communications device 20. This energy can be fed into the LCD lines, along with interfering energy generated by the LCD. FIG. 6 is a schematic circuit diagram showing a portion of a LCD circuit 290 having an LCD connector 300 and its filter components associated therewith that can be used with the mobile wireless communications device of FIGS. 1-3. FIG. 7 shows a LCD display circuit 350, LCD connector 400 and filter components operative with a wireless local area network (WLAN) communications device using similar features explained with reference to the mobile wireless communications device of FIGS. 1-3. The dashed line portion shown in FIGS. 6 and 7 indicates the general layout of LCD circuit components that could be included on a circuit board, including associated filter components and LCD connection lines.

The LCD 160, such as shown in FIG. 3, has a microprocessor (or CPU) 180 connection to the display 160 via an LCD connector 300 such as shown in FIG. 6. This connection is sometimes problematic because the LCD generates relatively high quality visual outputs but also generates radio frequency (RF) energy. When used in a mobile wireless communications device 20 such as a mobile handheld cellular phone, a PDA or a wireless local area network (WLAN) device, for example, the RF energy from the LCD can cause interference with the RF components of the device because they are typically in relatively close proximity to each other. This is particularly true with devices that use internal antennas, for example antennas positioned within a housing on a printed circuit board (PCB) or other similar antenna.

These microprocessors or CPUs generally operate at fairly high clock speeds, for example, based upon a 30 MHz clock signal which could be increased to three or four times that speed for internal use by the microprocessor. Thus, the microprocessor 180 may introduce harmonics into the connection lines to the LCD, which may in turn create further RF interference, as will be appreciated by those skilled in the art.

As shown in FIG. 6, electromagnetic interference (EMI) filters 310 are advantageously connected to the connection lines 312 extending between the microprocessor 180 and the LCD connector 300 to reduce the interference caused by harmonics from the microprocessor 180. The dashed line 314 in FIG. 6 indicates a functional area on the circuit board 67 which would include the various components, including the LCD connector 300 and the EMI filters 310 associated with the LCD connector 300.

By way of example, EMI filters can include respective bypass capacitors 320 connected between the LCD connection lines 312 and ground 322 as illustrated. The capacitors 320 that are shown in FIG. 6 can have a value of about 68 pF. In association with the capacitors 320 and the LCD connection lines 312 are EMI filters connected to the LCD circuitry to reduce the RF energy before it can be radiated by the LCD and interfere with the RF components. For example, the EMI filters can be EMI filters 324 such as KNA series EMI filters manufactured by AVX Corp. Examples of such filters include those sold under the designation as KNA 32200 and similar, KNA 32XXX series filters that are illustrated in the embodiments shown in FIGS. 6 and 7. Of course, other suitable EMI filters can also be used.

The LCD connector 300 typically includes a mounting plate-to-ground pin, and in the illustrated example, two such mounting plate-to-ground pins are labeled MP1 and MP2. The filters 324 are typically LC filters that give an excellent frequency response with respect to any attenuating noise coming from the microprocessor 180 to the LCD 160. These filters 324 are particularly adequate with respect to different frequency bands, e.g., the GSM 900 MHz and PCS 1900 MHz. These filters give about 30 to 40 decibel (dB) attenuation on these bands. Each filter 324 can be formed as a filter array as illustrated, for example, as an array of inductors 324a as illustrated.

The described LCD circuit can also include an LBAT terminal 330 and VBAT terminal 332, each having an appropriate filter 325 as illustrated in FIG. 6, using a pie configuration of capacitors 326 and inductors 328 for filtering.

FIG. 7 shows a LCD display circuit 350 that could be used with a mobile wireless communications device 20 such as a WLAN device and having a somewhat different circuit footprint configuration as compared to the circuit footprint configuration shown in FIG. 6. Similar functional components in this embodiment are given reference numerals starting in the 400 series. This circuit 350 uses 12 pF capacitors 420 connected to ground 422, the LCD connector 400, and into the LCD connection lines 412, which in turn, connect into the filter 424, formed as a filter array as illustrated and similar to that shown in FIG. 6. In this particular embodiment, however, ferrite beads 460 or similar inductor components are connected between the LCD connection lines 412 and the filter arrays 424, as illustrated. The circuit configuration in FIG. 7 is somewhat different than the circuit illustrated in FIG. 6 because a WLAN communications device would work at about 2.4 GHz. The ferrite beads 460 in combination with the capacitors 420 and filter arrays 424 are found to enhance performance. A voltage regulator circuit 470 can be operatively connected to the filter array 424, lines 412 and capacitors 420 as illustrated, and include appropriate ground, enable, Vin and Vout terminals.

The KNA series of filters 324, 424 are a distributed constant type LC filter that prevents ringing caused by circuit impedance. These types of filters are suitable for digital circuits and visual line circuits. They have an excellent noise attenuation over wide frequency ranges and is a low profile of about H=1.0 mm thickness that is suitable for small electronic devices. They can have a cutoff frequency at above 200 MHz and 100 milliamp rated current with 25 volts DC.

Referring once again to FIG. 3, the wireless mobile communications device 20 such as a handheld cellular communications device, includes a microprocessor (or CPU) 180, microphone 112, speaker 110, and serial communications port 108, such as an RS-232 or universal serial bus (USB) port, for example. The microphone 112 and speaker 110 are used for audio (i.e., voice) input and output during cellular telephone calls, for example, as will be appreciated by those skilled in the art. The device can also include auxiliary input/output (I/O) connectors 106, such as a headset connector, for example.

The serial port 108 can be used by the microprocessor 180 to communicate with a host computer, for example. In particular, in certain embodiments, the device 20 can provide personal digital assistant (PDA) features, as well as e-mail/Internet capabilities. In this case, any calendar, contacts, e-mails and similar functions can be synchronized between the device 20 and a host computer by the microprocessor 180, as will be appreciated by those skilled in the art. Moreover, the serial port 108 can be used for charging a battery of the device 20, e.g., by connecting the serial port to an AC/DC converter.

While the serial port 108 provides a relatively easy and convenient way for users to charge this device 20, a drawback of this approach is the interference that can be introduced onto the serial bus from an AC power source. Also, various audio components of the device 20 (e.g., the microphone 112, the speaker 110, headset connector, etc.) can be susceptible to interference from external RF sources, such as AM/FM or short wave radio and similar transmissions. This is particularly true in the 80 MHz to the 2 GHz frequency range, for example.

The susceptibility of the communications device 20 to interference over a serial bus during charging and/or from RF transmissions interfering with the audio components decreases the overall interference immunity of the device. Some regulating bodies are now requiring wireless communications devices to comply not only with interference guidelines (i.e., to not cause excessive interference), but also have a certain level of immunity to interference from other RF sources. By way of an example, RnTte immunity testing is now required for many RF communications devices in Europe. Unfortunately, the test can be subject to interference.

Figure 8A:
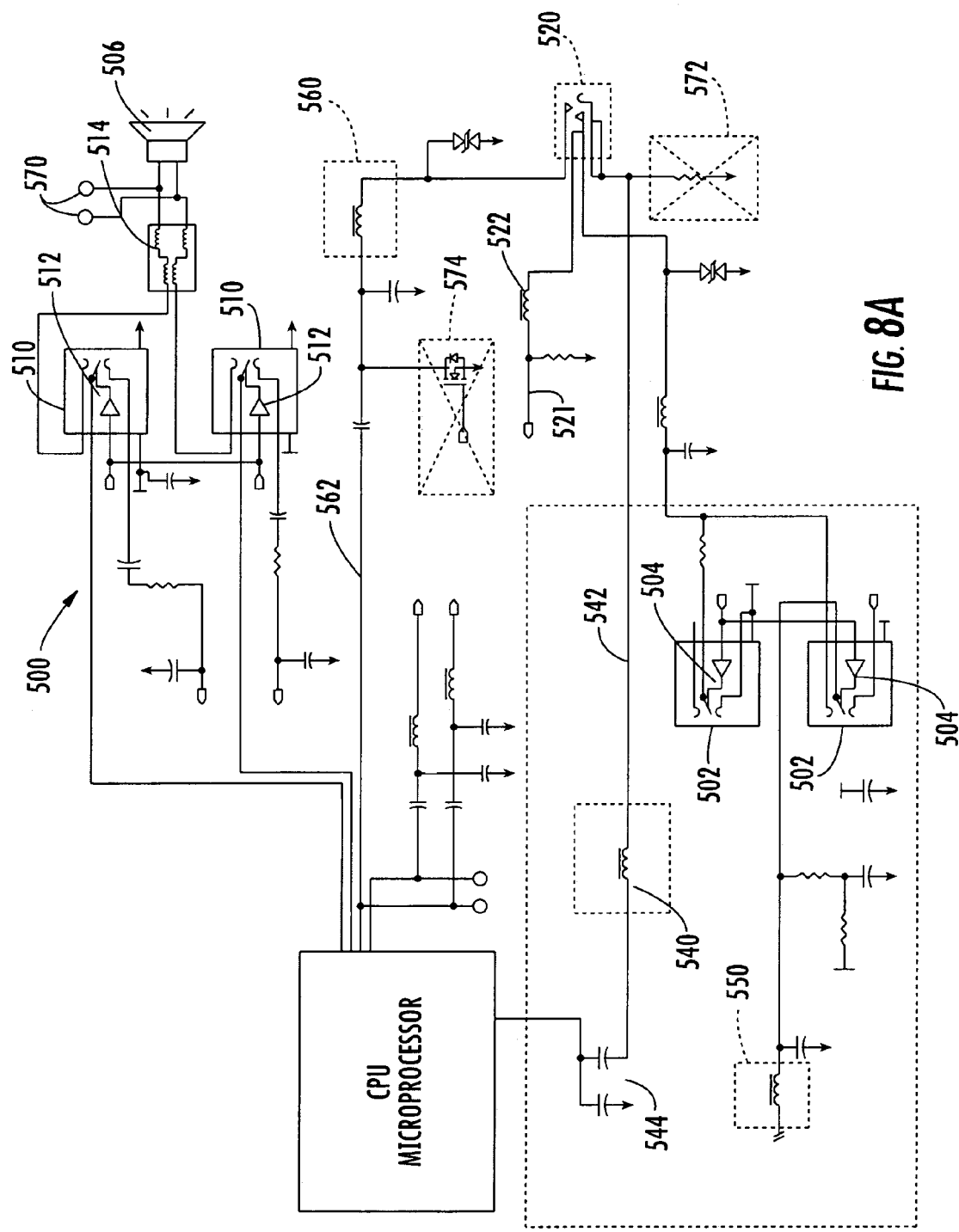
FIG. 8A is a schematic circuit diagram of a first embodiment of an audio circuit as part of an RF circuit having audio filtering components that can be used with the mobile wireless communications device of FIGS. 1-3.
Figure 8B:
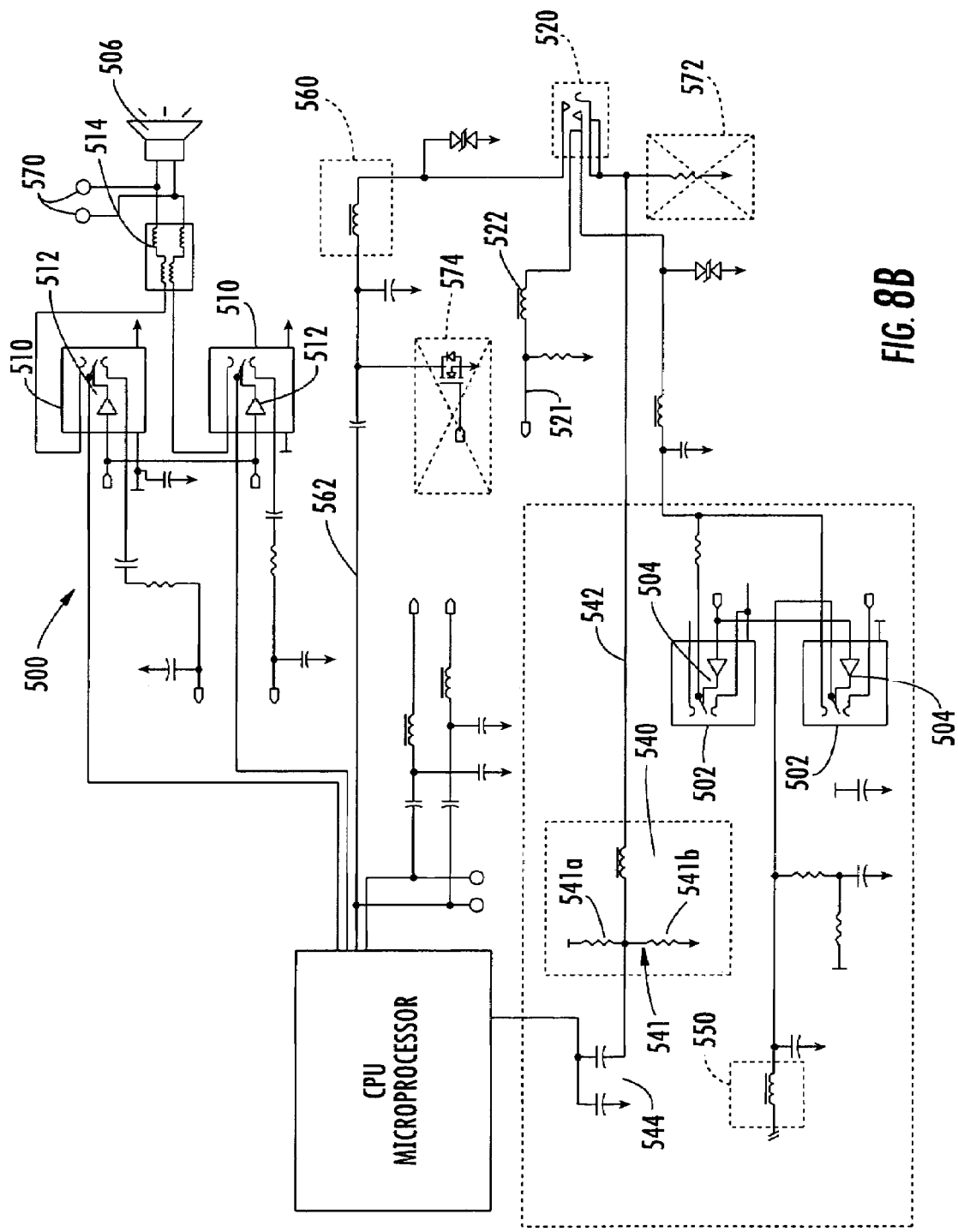
FIG. 8B is a schematic circuit diagram of a second embodiment of an audio circuit as part of an RF circuit having audio filtering components that can be used with the mobile wireless communications device of FIGS. 1-3.

FIGS. 8A and 8B show a basic audio circuit 500, including serial bus connections that can be used for mobile wireless communications device 20 shown in FIGS. 1-3.

This circuit 500 now has certain types of values of filters placed around the device to reduce immunity. Basic audio components are shown in the dashed rectangular box and include two microphone audio switches 502, which include a headset detect circuit 504 that is triggered when the headset jack has an external speaker microphone connected thereto. It detects the microphone and switches the lines over. At the receiver speaker 506 are two speaker audio switches 510, each with a detect circuit 512 that detects when the earphone is connected and switches the line over, and inductor component 514 operative with the receiver speaker 506 and the audio switches 510. A physical jack is indicated at 520 and receives a jack input and connects to headset detect line and terminal 521, which also includes a serially connected inductor 522. The described components are connected together and operative with the microprocessor and other components, for example, various inductors, diodes, capacitors, resistors, and associated circuit components.

To increase the immunity (i.e., reduce the susceptibility) of the device 20 to electromagnetic interference (EMI), a plurality of EMI filters are added to the audio and/or serial bus circuit 500 of the communications device 20. As shown in FIGS. 8A and 8B, for example, choke filters (i.e., inductors) can include respective individual inductors for this purpose. A choke filter 540 is operatively connected into connection line 542 between the physical jack 520 and the microprocessor 180. This connection line 542 includes a capacitor circuit 544. Another choke filter 550 is operatively connected to the microphone audio switches 502. Yet another choke filter 560 is operatively connected to the physical jack 520 and the microprocessor 180 on a connection line 562. Although the inductor or choke filters as illustrated and positioned in the respective selected circuit positions, it should be understood that other filters can be used for the present invention.

The choke filter 540 also can interconnect to a resistor divider circuit 541 that includes resistors 541a, 541b for changing the bias on the choke filter 540 as shown in FIG. 8B. This particular circuit layout using the resistor divider 541 shown in FIG. 8B is more sensitive to differential AC and DC lines. The resistor divider circuit 541 allows a different bias, canceling some noise.

Other basic components included in FIGS. 8A and 8B include the test points 570 near the receiver speaker. Some proposed components and circuit designs were removed. For example, a resistor circuit indicated by the dashed X at 572 near the physical jack 520 and a transistor circuit indicated by the dashed X at 574 were initially included in a circuit design and operatively connected to the ground connection of the physical jack and the microprocessor. These circuits 572, 574 were removed as indicated by the dashed-out box.

Figure 9:
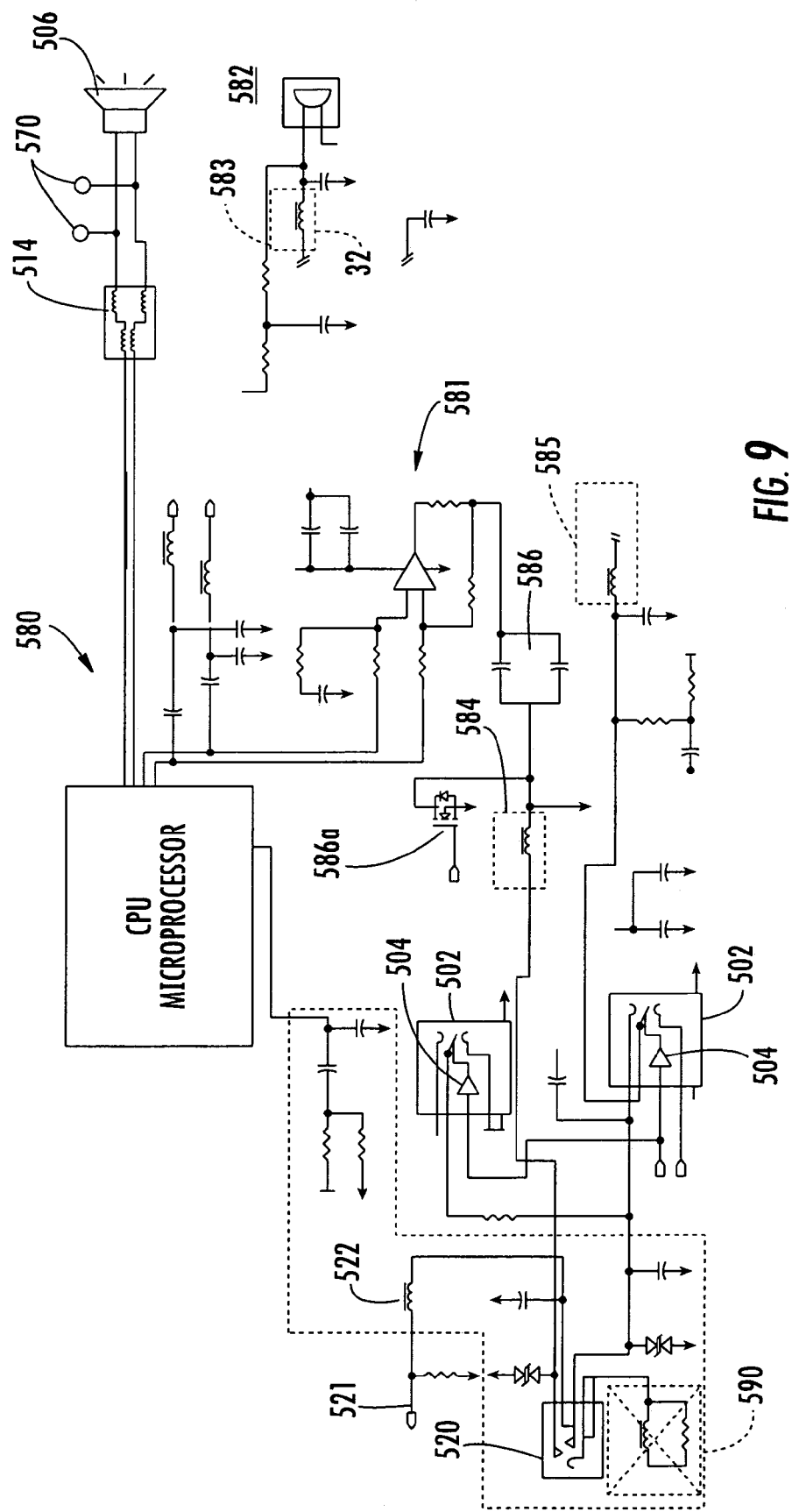
FIG. 9 is a schematic circuit diagram of another embodiment of an audio circuit as part of an RF circuit similar to FIGS. 8A and 8B, but having a different circuit footprint and different positioning of audio filtering components.

FIG. 9 is a schematic circuit diagram for an audio circuit 580 that includes serial bus connections and having another circuit footprint, such as for a mobile wireless communications device 20, and showing similar components in a different configuration. Any similar components have been given the same reference numeral. This circuit 580 also includes an operational amplifier circuit 581 operatively connected to the microprocessor 180 and operative as a filter or buffer. FIG. 9 also shows a microphone circuit 582, which would be operative with microphone audio switches 502, even though in this fragmentary schematic circuit diagram it is shown separate. Choke filter 583 is operatively connected to the microphone circuit 582. A choke filter 584 is operatively connected to the physical jack 520 and the operational amplifier circuit 581. Another choke filter 585 is operatively connected to a microphone audio switch 502. Other circuit components can be connected as illustrated in this non-limiting example.

A previously designed inductor RL filter as indicated by the dashed lines and crossed out "X" at 590 was found not to be as operative as the choke filters as described and removed from the circuit design. The choke filters are advantageous at the frequency band about 40 MHz, which has a strong impact on the immunity performance of the radio. Critical spots are selectively chosen for these ESP filters designed in these examples of choke filters. A capacitor circuit 586 is connected between operational amplifier 581 and input jack 520 for determining connection. A transistor circuit 586a is included in this design and operatively connected between the operational amplifier circuit 581 and into connection lines for the filter 584 and input jack 520. The circuit 580 includes other components that are connected as illustrated in this non-limiting example.

By way of example, the choke filters as described with reference to FIGS. 8A, 8B and 9 could be ferrite filters, for example, although other suitable filter components and/or materials may also be used, as will be appreciated by those skilled in the art. In addition to positioning the EMI filters to reduce unwanted interference, other components connected to the audio and/or serial bus circuitry can be scrutinized to determine if interference susceptibility effects.

The use of the added choke filters advantageously reduces conducted interfering energy introduced to the audio components via a serial (i.e., USB) charging cable and other sources. This further reduces radiated interfering RF energy introduced to the audio components via the microphone 112 (FIG. 3) or the microphone of a connected headset, for example.

Figure 10A:
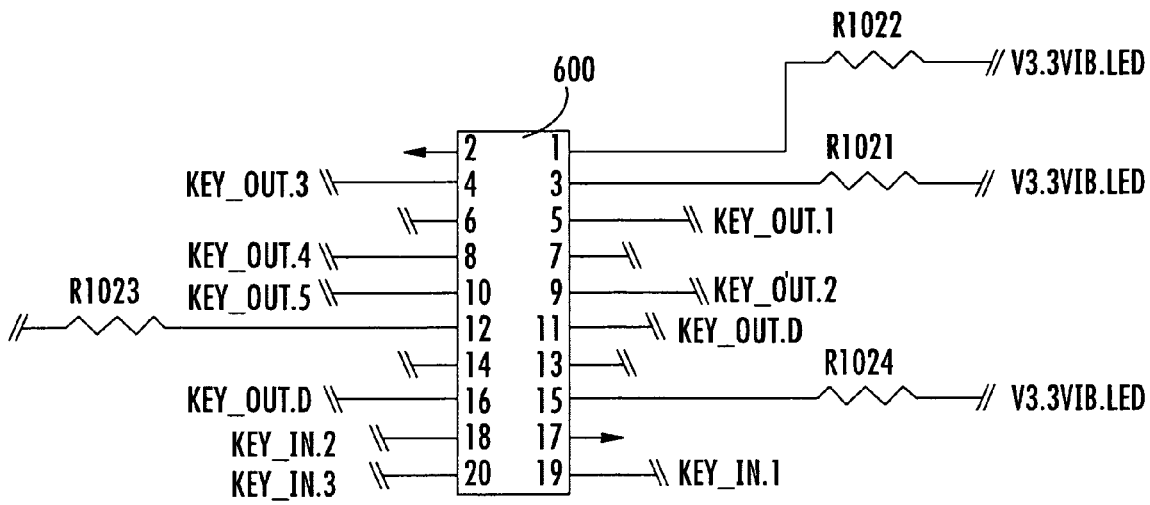
FIG. 10A is an example of a keyboard connector that can be used in the mobile wireless communications device shown in FIGS. 1-3, and adapted to have electromagnetic interference (EMI) filtering components connected thereto.
Figure 10B:
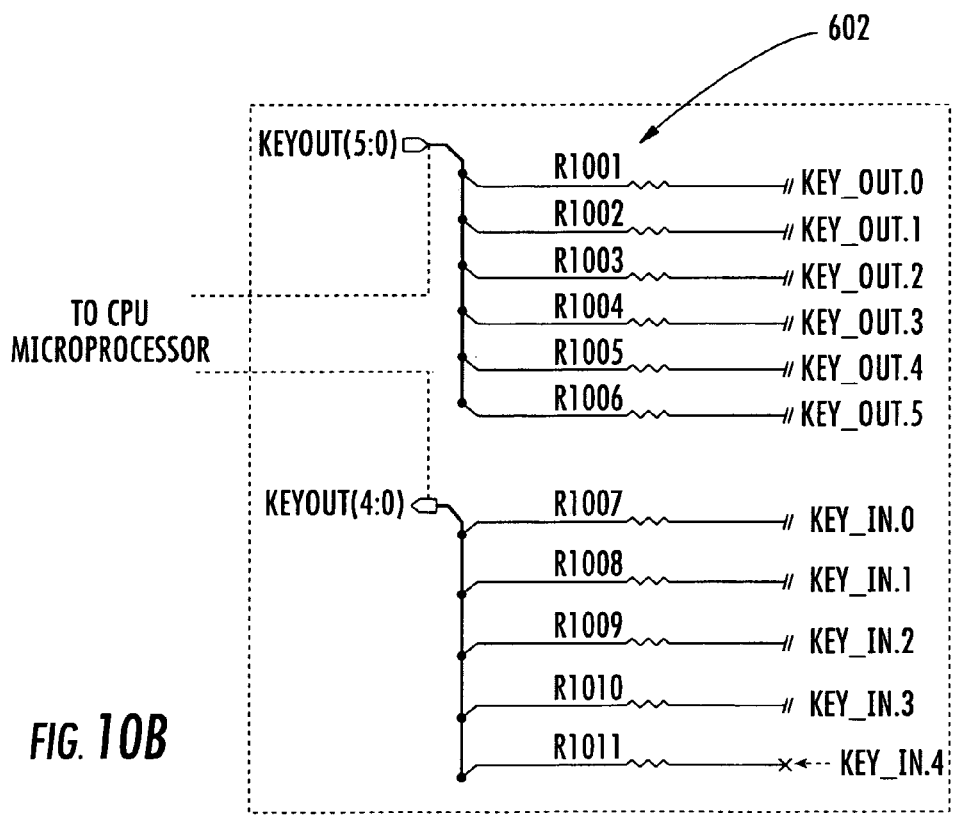
FIG. 10B is a schematic circuit diagram of one example of EMI filtering components that can be connected to the keyboard connector shown in FIG. 10A and operative for filtering when communications signals are received.

As noted before, the keypad (keyboard) and its associated circuitry connected to other components can create interference. This can be especially true when the keypad (keyboard) is in close proximity. FIGS. 10A and 10B show a respective keyboard connector 600 that can be used in the mobile wireless communications device shown in FIGS. 1-3 and have EMI filtering components connected thereto. This keyboard connector 600 includes appropriate LED pins and lines that connect to serial elements as filtering components 602 and Key-Out and Key-In lines as shown in FIG. 10B. In the illustrated embodiment, the keyboard connector 600 is a female connector and receives a male plug extending from the separate keypad connector positioned on a separate keyboard and connects thereto.

FIG. 10B is a schematic circuit diagram of an example of EMI filtering components 602 that can be connected to the keyboard connector 600 shown in FIG. 10A and used in the mobile wireless communications device of FIGS. 1-3 and operative for filtering when receiving signals.

Figure 11A:
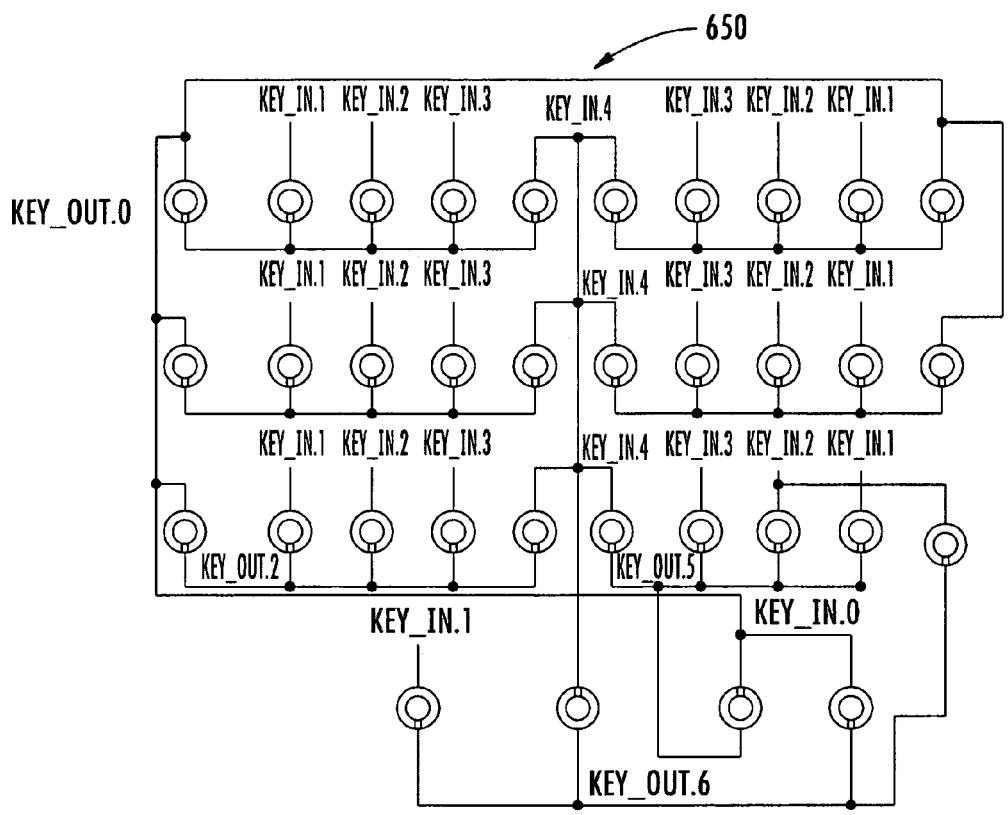
FIG. 11A is a schematic circuit diagram of an example of a key array that can be used in a mobile wireless local area network (WLAN) communications device and adapted to have EMI filtering components connected thereto.
Figure 11B:
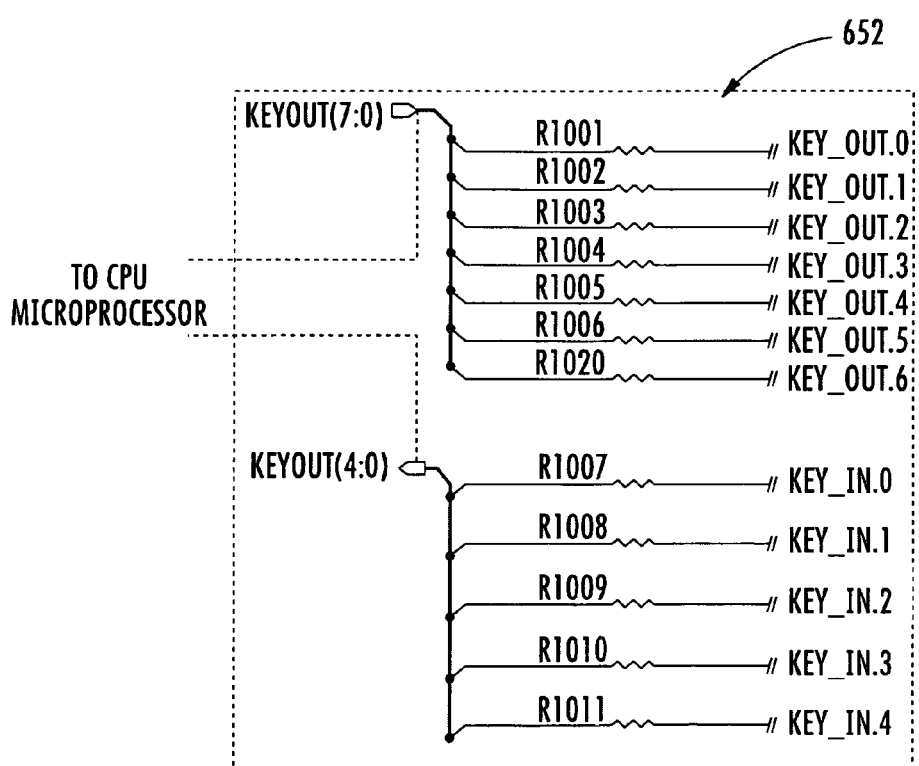
FIG. 11B is a schematic circuit diagram of an EMI filtering components that can be connected to the key array shown in FIG. 11A for filtering when signals are received.

FIG. 11A is a schematic circuit diagram of a key array circuit 650 for a keypad, which can be used in a mobile wireless communications device 20 such as a local area network (WLAN) communications device. This key array circuit 650 could be on a separate keyboard. FIG. 11B is a schematic circuit diagram of an example of the filtering components 652 that can be connected either to the Key_In or Key_Out lines and used in a mobile wireless local area network (WLAN) communications device and operative when receiving signals. It should be understood that the key array circuit 650 includes various Key_In and Key_Out and other lines and terminals as illustrated.

It should be understood that the microprocessor (or CPU) 180 as shown in FIG. 3 has a keypad (keyboard) 140 coupled to the microprocessor, and the cellular communication subsystem 101. The cellular communication subsystem 101 includes a cellular receiver 150 and cellular transmitter 152, and their respective associated antennas 154 and 156. Of course, it should be noted that a single antenna can be used in certain embodiments.

The keypad 140 may be a numeric keypad for use in placing cellular telephone calls, as will be appreciated by those skilled in the art. Moreover, in certain embodiments in which the device 20 advantageously provides personal digital assistant (PDA) and/or email/Internet functionality, the keypad 140 may include alphanumeric keys and other function keys, as will also be appreciated by those skilled in the art.

The microprocessor 180 may operate at clock speed of tens or even hundreds of megahertz (or higher) in a typical cellular device performing PDA operations, for example. Yet, such relatively high clock speeds can introduce digital harmonics in the lines connecting the microprocessor 180 with the keypad 140. This may result in RF interference energy, which reduces the sensitivity of the receiver 150. That is, the sensitivity of the RF receiver 150 may be significantly degraded by the digital noise generated by the microprocessor 180 on the Key-Out and Key-In lines, which is radiated from the keyboard traces and picked up by the antenna 154.

In accordance with an embodiment of the present invention shown in FIGS. 10A and 10B, and another embodiment shown in FIGS. 11A and 11B, electromagnetic interference (EMI) filters 602, 652 are advantageously coupled to the Key_In and Key_Out lines to reduce the RF interference picked up by the antenna 154. An exemplary EMI filter array 602 is illustrated in FIG. 10B. The EMI filter array 602 illustratively includes series elements formed as resistors R1001 through R1006 respectively coupled to Key_Out lines KEY_OUT_0 through KEY_OUT_5, and resistors R1007 through R1011 respectively coupled to key in lines KEY_IN_0 through KEY_IN_4. The values of the resistors R1001-R1011 are selected based upon the parasitic capacitance and/or inductance of the Key_Out and Key_In lines to provide an RC, RL, or RLC filter with desired filtering characteristics. Yet, these values should also be selected so as not to cause undue signal degradation over the Key_Out and Key_In lines. By way of example, 1K Ohm resistors were used in the illustrated example, although other values may be used in other embodiments. These series elements formed as resistors and connected between the microprocessor or other CPU circuit and keyboard connector has been found advantageous when high Q values are involved. The resistors could be surface mount resistors on the circuit board 67. The resistors can be connected in-line with the printed conductive traces used for Key_Out and Key_In lines. Other configurations are possible, of course.

Moreover, other types of EMI filtering components may be used in addition to, or instead of, those noted above. For example, resistors, inductors, shunt capacitors, EMI ferrite beads, or a combination thereof may be used in different embodiments, as will be appreciated by those skilled in the art.

An exemplary embodiment of a portion of a circuit for a wireless local area network (WLAN) device with a similar EMI filter array is illustrated in FIGS. 11A and 11B. The filter array 652 connects to the key array circuit 650 via the Key_Out and Key_In lines (FIG. 11A). The EMI filter array 652 illustratively includes series elements formed as resistors R1001-R1006 and R1020 respectively connected to Key_Out lines KEY_OUT_0 through KEY_OUT_6, and resistors R1007-R1011 respectively connected to Key_In lines KEY_IN_0 through KEY_IN_4. Here again, other series elements or other filtering arrangements may be used as well.

As noted before with reference to FIG. 3, the keypad 140 may be a numeric keypad array for use in placing cellular telephone calls, as will be appreciated by those skilled in the art. In the embodiment illustrated in FIG. 3, the device 20 advantageously provides personal digital assistant (PDA) and/or email/Internet functionality. As such, the keypad 140 illustratively includes alphanumeric keys and other function keys, to allow text typing as well as number entry for placing phone calls.

During transmission, radio frequency (RF) energy from the transmitter 152 and its associated antenna 156 can interfere with or couple to the input/output (I/O) lines of the microprocessor 180 through the KEY_IN and KEY_OUT lines connecting the microprocessor and the keypad 140. This interference may cause a variety of problems, potentially as severe as resetting the microprocessor. This is especially problematic with the higher power GSM cellular phones and assorted communications devices that operate with about two (2) watts and higher output power. This, in turn, could cause a user to lose a message or other document in progress, or to be cut off during a phone call, for example.

In accordance with one embodiment of the present invention shown in FIG. 12, a keypad connector 700 is positioned on a separate keyboard and is operatively connected to a keypad array circuit 720 shown in schematic circuit diagram. This keypad connector operates as a keyboard connector that connects to the keyboard connector on the circuit board. Various light emitting diodes (LED's) 730 are connected to the keypad connector. Test points 732 are illustrated as operatively connected to the keypad array circuit. The keypad connector 700 can be similar in design as the keyboard connector 600 except with a reverse configuration to allow the connectors to clip or connect together. In the embodiment shown in FIG. 12, a plurality of series connected elements, e.g., resistors R1-R8, are advantageously coupled to the KEY_IN and KEY_OUT lines on the separate keyboard to dampen RF energy picked up by these lines, either from the antenna 156 or from external interference. The values of the resistors R1-R8 are carefully chosen based upon the parasitic capacitance and/or inductance of the Key-Out and Key-In lines to provide an RC, RL, or RLC filter with desired filtering characteristics. However, it is important that these values not be so large that they effect the normal operation of the microprocessor 180 and/or the keyboard 140.

In the example illustrated in FIG. 12, the resistors R1-R8 are all 500 Ohm resistors, although other resistor values may be used in different embodiments. The series elements, e.g., resistors R1-R8, are preferably positioned on the keyboard itself adjacent the keys. For example, the resistors R1-R8 may be surface mount resistors on a keyboard printed circuit board (PCB) or other board, such as a main board 67, and the resistors may be connected in line with the printed conductive traces used for the Key_Out and Key_In lines. Of course, other configurations known to those skilled in the art are also possible.

In addition, other types of EMI filtering components may be used in addition to, or instead of, those noted above. For example, resistors, inductors, shunt capacitors, EMI ferrite beads, or a combination thereof may be used in different embodiments, as will be appreciated by those skilled in the art. It should also be noted that the above-described EMI filtering components may be used in devices other than cellular devices, such as mobile handheld wireless local area network (WLAN) devices, for example, as will be appreciated by those skilled in the art. Operative with the keyboard connection are Light Emitting Diodes (LED's), which emit light therefrom.

This application is related to copending patent applications entitled, "MOBILE WIRELESS COMMUNICATIONS DEVICE WITH REDUCED MICROPHONE NOISE FROM RADIO FREQUENCY COMMUNICATIONS CIRCUITRY," "MOBILE WIRELESS COMMUNICATIONS DEVICE WITH REDUCED INTERFERING ENERGY INTO AUDIO CIRCUIT AND RELATED METHODS," "MOBILE WIRELESS COMMUNICATIONS DEVICE WITH REDUCED INTERFERENCE FROM THE KEYBOARD INTO THE RADIO RECEIVER," and "MOBILE WIRELESS COMMUNICATIONS DEVICE WITH REDUCED INTERFERING ENERGY FROM THE KEYBOARD," which are filed on the same date and by the same assignee and inventors.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A mobile wireless communications device comprising:
a housing;
a circuit board carried by the housing and including radio frequency (RF) circuitry and a processor carried by the circuit board and operative with each other;
a display connector mounted on the circuit board and adapted to be connected to a display;
display connection lines carried by the circuit board as uninterrupted signal traces formed planar on the circuit board and interconnecting the display connector and the processor for carrying signals from the processor for display on a display connected to the display connector; and
filters carried by the circuit board, wherein a filter is connected serially into each display connection lines for reducing any interfering energy from the processor and a display into the display connection lines.

2. A mobile wireless communications device according to claim 1, and further comprising a bypass capacitor connected to ground and into each respective display connection line.

3. A mobile wireless communications device according to claim 1, wherein each filter comprises a ferrite inductor.

4. A mobile wireless communications device according to claim 1, wherein each filter comprises an LC filter serially connected into each display connection line.

5. A mobile wireless communications device according to claim 1, wherein said housing is configured for handheld operation.

6. A mobile wireless communications device according to claim 1, wherein said RF circuitry and processor are operative as a cellular communications device.

7. A mobile wireless communications device according to claim 1, wherein said filters form a plurality of arrays of LC filters serially connected into said display connection lines.

8. A mobile wireless communications device according to claim 1, and further comprising a voltage regulator circuit operatively connected to said filters wherein said RF circuitry and processor are operative as a wireless local area network (WLAN) device.

9. A mobile wireless communications device according to claim 1, and further comprising a second filter element connected into each display connection line and serially connected to each other filter within said display connection line.

10. A mobile wireless communications device according to claim 9, wherein said second filter element comprises an inductor.

11. A mobile wireless communications device comprising:
a housing;
a circuit board carried by the housing and including radio frequency (RF) circuitry and a processor carried by the circuit board and operative with each other;
an antenna mounted within the housing and operative with the RF circuitry;
a liquid crystal display (LCD) carried by the housing;
an LCD connector mounted on the circuit board and connected to the LCD;
parallel LCD connection lines carried by the circuit board as uninterrupted signal traces formed planar on the circuit board and interconnecting the LCD connector and the processor for carrying signals from the processor to the LCD for display thereon; and
filters carried by the circuit board, wherein a filter is connected serially into each LCD connection line for reducing any interfering energy from the processor and LCD into the LCD connection lines.

12. A mobile wireless communications device according to claim 11, and further comprising a bypass capacitor connected to ground and into each respective LCD connection line.

13. A mobile wireless communications device according to claim 11, wherein each filter comprises a ferrite inductor.

14. A mobile wireless communications device according to claim 11, wherein each filter comprises an LC filter.

15. A mobile wireless communications device according to claim 11, wherein said housing is configured for handheld operation.

16. A mobile wireless communications device according to claim 11, wherein said RF circuitry and processor are operative as a cellular communications device.

17. A mobile wireless communications device according to claim 11, wherein a plurality of said filters form an array of filters serially connected into a plurality of LCD connection lines.

18. A mobile wireless communications device according to claim 17, wherein each array of filters comprises LC filters.

19. A mobile wireless communications device according to claim 11, and further comprising a voltage regulator circuit operatively connected to said filters wherein said RF circuitry and processor are operative as a wireless local area network (WLAN) device.

20. A mobile wireless communications device according to claim 11, and further comprising a second filter element connected into each LCD connection line and serially connected to each other filter that is connected within said LCD connection line.

21. A mobile wireless communications device according to claim 20, wherein said second filter element comprises an inductor.

22. A method for making a mobile wireless communications device, which comprises:
providing a housing, a circuit board carried by the housing, radio frequency (RF) circuitry and a processor carried by the circuit board and operative with each other, a display connector on the circuit board and adapted to be connected to a display, and display connection lines carried by the circuit board as uninterrupted signal traces formed planar on the circuit board and operatively connected to the processor and the display connector for carrying signals from the processor to the display connector to be displayed on a display connected thereto; and reducing interfering energy from the processor and a display into the display connection lines by connecting an electromagnetic interference (EMI) filter serially into each display connection line.

23. A method according to claim 22, which further comprises connecting to each display connection line a bypass capacitor that is connected to ground.

24. A method according to claim 22, which further comprises connecting an LC filter into each display connection line.

* * * * *